(12) United States Patent
Takayama et al.

(10) Patent No.: US 7,294,517 B2
(45) Date of Patent: Nov. 13, 2007

(54) LIGHT EMITTING DEVICE AND METHOD OF FABRICATING THE SAME

(75) Inventors: Toru Takayama, Atsugi (JP); Hirokazu Yamagata, Atsugi (JP); Akihiko Koura, Atsugi (JP); Shunpei Yamazaki, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/172,749

(22) Filed: Jun. 17, 2002

(65) Prior Publication Data

US 2003/0089913 A1 May 15, 2003

(30) Foreign Application Priority Data

Jun. 18, 2001 (JP) .............................. 2001-184067

(51) Int. Cl.
*H01L 21/00* (2006.01)
(52) U.S. Cl. .............................. 438/23; 438/22; 438/46; 438/149
(58) Field of Classification Search .................. 438/22, 438/23, 46, 149
See application file for complete search history.

(56) References Cited

U.S. PATENT DOCUMENTS

| | | |
|---|---|---|
| 4,356,429 A | 10/1982 | Tang |
| 4,530,750 A | 7/1985 | Aisenberg et al. |
| 4,539,507 A | 9/1985 | VanSlyke et al. |
| 4,720,432 A | 1/1988 | VanSlyke et al. |

(Continued)

FOREIGN PATENT DOCUMENTS

CN 1278660 1/2001

(Continued)

OTHER PUBLICATIONS

U.S. Appl. No. 09/587,369—Filed Jun. 2, 2000—"Electro-optical Device and Electronic Device" Yamazaki et al.

(Continued)

*Primary Examiner*—Long Pham
(74) *Attorney, Agent, or Firm*—Nixon Peabody LLP; Jeffrey L. Costellia

(57) ABSTRACT

It is characteristic of an organic material suited to an interlayer insulating film to transmit vapor therethrough and to be liable to absorb moisture, and the material has a disadvantage that it is extremely susceptible to oxygen and moisture to be readily deteriorated no matter whether it is low-molecular or high-molecular. Further, alkali metal or alkaline earth metal is used for a positive electrode or a negative electrode of a light emitting element, and these are liable to be oxidized by oxygen. Thus moisture is responsible for deterioration of a light emitting element and for failure such as dark spots or the like. A light emitting device is provided to comprise an interlayer insulating film comprising a high molecular chemical compound and formed on a TFT formed on an insulating surface, a light emitting element, which is provided on the interlayer insulating film, and in which a light emitting layer comprising an organic chemical compound is formed between a pair of electrodes, and an inorganic insulating film containing silicon and nitrogen as its main components or a carbon film possessing a $SP^3$ coupling and containing hydrogen formed between the interlayer insulating film and the light emitting element.

26 Claims, 13 Drawing Sheets

U.S. PATENT DOCUMENTS

| | | | |
|---|---|---|---|
| 4,769,292 A | 9/1988 | Tang et al. | |
| 4,885,211 A | 12/1989 | Tang et al. | |
| 4,950,950 A | 8/1990 | Perry et al. | |
| 4,975,338 A | 12/1990 | Kageyama et al. | |
| 5,003,221 A | 3/1991 | Shimizu | |
| 5,047,687 A | 9/1991 | VanSlyke | |
| 5,059,861 A | 10/1991 | Littman et al. | |
| 5,059,862 A | 10/1991 | VanSlyke et al. | |
| 5,061,617 A | 10/1991 | Maskasky | |
| 5,073,446 A | 12/1991 | Scozzafava et al. | |
| 5,107,175 A | 4/1992 | Hirano et al. | |
| 5,124,204 A | 6/1992 | Yamashita et al. | |
| 5,151,629 A | 9/1992 | VanSlyke | |
| 5,189,405 A | 2/1993 | Yamashita et al. | |
| 5,217,700 A | 6/1993 | Kurihara et al. | |
| 5,247,190 A | 9/1993 | Friend et al. | |
| 5,270,267 A | 12/1993 | Ouellet | |
| 5,294,869 A | 3/1994 | Tang et al. | |
| 5,294,870 A | 3/1994 | Tang et al. | |
| 5,338,364 A | 8/1994 | Kurihara et al. | |
| 5,399,502 A | 3/1995 | Friend et al. | |
| 5,438,241 A | 8/1995 | Zavracky et al. | |
| 5,482,896 A | 1/1996 | Tang | |
| 5,496,597 A | 3/1996 | Soininen et al. | |
| 5,530,269 A | 6/1996 | Tang | |
| 5,550,066 A | 8/1996 | Tang et al. | |
| 5,552,668 A | 9/1996 | Hirose et al. | |
| 5,641,991 A | 6/1997 | Sakoh | |
| 5,643,423 A * | 7/1997 | Kimock et al. | 204/192.35 |
| 5,643,826 A | 7/1997 | Ohtani et al. | |
| 5,674,304 A | 10/1997 | Fukada et al. | |
| 5,680,165 A | 10/1997 | Takizawa et al. | |
| 5,680,185 A | 10/1997 | Kobayashi et al. | |
| 5,684,365 A | 11/1997 | Tang et al. | |
| 5,686,360 A | 11/1997 | Harvey, III et al. | |
| 5,688,551 A | 11/1997 | Littman et al. | |
| 5,693,956 A | 12/1997 | Shi et al. | |
| 5,747,930 A | 5/1998 | Utsugi | |
| 5,757,126 A | 5/1998 | Harvey, III et al. | |
| 5,771,562 A | 6/1998 | Harvey, III et al. | |
| 5,776,594 A * | 7/1998 | Austin | 428/212 |
| 5,811,177 A | 9/1998 | Shi et al. | |
| 5,817,366 A | 10/1998 | Arai et al. | |
| 5,824,374 A | 10/1998 | Bradley, Jr. et al. | |
| 5,839,456 A | 11/1998 | Han | |
| 5,853,905 A | 12/1998 | So et al. | |
| 5,882,761 A | 3/1999 | Kawami et al. | |
| 5,889,459 A | 3/1999 | Hattori et al. | |
| 5,923,962 A | 7/1999 | Ohtani et al. | |
| 5,929,487 A | 7/1999 | Fukada et al. | |
| 5,952,708 A | 9/1999 | Yamazaki | |
| 5,952,778 A | 9/1999 | Haskal et al. | |
| 5,962,962 A | 10/1999 | Fujita et al. | |
| 5,990,542 A | 11/1999 | Yamazaki | |
| 6,028,325 A | 2/2000 | Yamazaki | |
| 6,049,167 A | 4/2000 | Onitsuka et al. | |
| 6,057,647 A | 5/2000 | Kurosawa et al. | |
| 6,097,459 A | 8/2000 | Shimada et al. | |
| 6,100,954 A | 8/2000 | Kim et al. | |
| 6,114,183 A | 9/2000 | Hamada et al. | |
| 6,114,715 A * | 9/2000 | Hamada et al. | 257/72 |
| 6,115,090 A | 9/2000 | Yamazaki | |
| 6,132,280 A | 10/2000 | Tanabe et al. | |
| 6,146,225 A | 11/2000 | Sheats et al. | |
| 6,150,187 A | 11/2000 | Zyung et al. | |
| 6,150,668 A | 11/2000 | Bao et al. | |
| 6,169,293 B1 | 1/2001 | Yamazaki | |
| 6,194,837 B1 * | 2/2001 | Ozawa | 315/169.1 |
| 6,198,217 B1 | 3/2001 | Suzuki et al. | |
| 6,198,220 B1 | 3/2001 | Jones et al. | |
| 6,215,244 B1 | 4/2001 | Kuribayashi et al. | |
| 6,239,470 B1 | 5/2001 | Yamazaki | |
| 6,246,179 B1 | 6/2001 | Yamada | |
| 6,251,712 B1 | 6/2001 | Tanaka et al. | |
| 6,268,631 B1 | 7/2001 | Fukada et al. | |
| 6,268,695 B1 | 7/2001 | Affinito | |
| 6,268,842 B1 | 7/2001 | Yamazaki et al. | |
| 6,274,887 B1 | 8/2001 | Yamazaki et al. | |
| 6,278,132 B1 | 8/2001 | Yamazaki et al. | |
| 6,283,578 B1 | 9/2001 | Popall et al. | |
| 6,303,963 B1 | 10/2001 | Ohtani et al. | |
| 6,316,810 B1 | 11/2001 | Yamazaki et al. | |
| 6,329,036 B1 | 12/2001 | Kikukawa et al. | |
| 6,337,492 B1 | 1/2002 | Jones et al. | |
| 6,359,606 B1 | 3/2002 | Yudasaka | |
| 6,362,507 B1 * | 3/2002 | Ogawa et al. | 257/350 |
| 6,369,495 B2 | 4/2002 | Codama et al. | |
| 6,413,645 B1 | 7/2002 | Graff et al. | |
| 6,441,468 B1 | 8/2002 | Yamazaki | |
| 6,445,059 B1 | 9/2002 | Yamazaki | |
| 6,489,631 B2 * | 12/2002 | Young et al. | 257/59 |
| 6,512,504 B1 | 1/2003 | Yamauchi et al. | |
| 6,525,339 B2 * | 2/2003 | Motomatsu | 257/40 |
| 6,531,713 B1 | 3/2003 | Yamazaki | |
| 6,534,826 B2 | 3/2003 | Yamazaki | |
| 6,548,172 B2 * | 4/2003 | David et al. | 428/403 |
| 6,555,253 B2 * | 4/2003 | Hamada et al. | 428/690 |
| 6,576,924 B1 | 6/2003 | Yamazaki et al. | |
| 6,593,990 B1 | 7/2003 | Yamazaki | |
| 6,596,134 B2 * | 7/2003 | Forrest et al. | 204/192.29 |
| 6,689,492 B1 | 2/2004 | Yamazaki et al. | |
| 6,717,181 B2 | 4/2004 | Murakami et al. | |
| 6,753,257 B2 | 6/2004 | Yamazaki | |
| 6,784,037 B2 | 8/2004 | Yamazaki et al. | |
| 6,828,727 B2 | 12/2004 | Yamazaki | |
| 6,833,560 B2 | 12/2004 | Konuma et al. | |
| 6,927,826 B2 | 8/2005 | Yamazaki | |
| 7,113,154 B1 | 9/2006 | Inukai | |
| 7,147,530 B2 | 12/2006 | Yamazaki et al. | |
| 2001/0002144 A1 | 5/2001 | Yamazaki | |
| 2001/0019133 A1 | 9/2001 | Konuma et al. | |
| 2001/0050364 A1 * | 12/2001 | Tanaka et al. | 257/66 |
| 2002/0180371 A1 | 12/2002 | Yamazaki et al. | |
| 2002/0190256 A1 | 12/2002 | Murakami et al. | |
| 2003/0019859 A1 * | 1/2003 | Sol | 219/203 |
| 2003/0089991 A1 | 5/2003 | Yamazaki et al. | |
| 2003/0129790 A1 | 7/2003 | Yamazaki et al. | |
| 2003/0201439 A1 | 10/2003 | Yamazaki et al. | |
| 2004/0061438 A1 | 4/2004 | Yamazaki et al. | |
| 2004/0157564 A1 | 8/2004 | Murakami et al. | |
| 2005/0029522 A1 | 2/2005 | Konuma et al. | |
| 2005/0093436 A1 | 5/2005 | Yamazaki | |
| 2005/0197031 A1 | 9/2005 | Yamazaki et al. | |
| 2005/0206313 A1 | 9/2005 | Yamazaki et al. | |
| 2005/0208863 A1 | 9/2005 | Yamazaki et al. | |
| 2005/0264740 A1 | 12/2005 | Yamazaki | |

FOREIGN PATENT DOCUMENTS

| | | |
|---|---|---|
| EP | 0 999 595 A2 | 5/2000 |
| EP | 1 028 469 A2 | 8/2000 |
| EP | 1 058 314 A2 | 12/2000 |
| EP | 1 058 484 A1 | 12/2000 |
| EP | 1058484 | 12/2000 |
| EP | 1 128 436 A1 | 8/2001 |
| EP | 1 376 713 A2 | 1/2004 |
| JP | 08-241047 | 9/1996 |
| JP | 8-335579 | 12/1996 |
| JP | 10-268360 | 10/1998 |
| JP | 11-283752 | 10/1999 |
| JP | 2000-299468 | 10/2000 |
| JP | 2000-323273 | 11/2000 |
| JP | 2001-052873 | 2/2001 |
| JP | 2001-066632 | 3/2001 |

| JP | 2001-077374 | 3/2001 |
| JP | 2001-102165 | 4/2001 |
| JP | 2001-312223 | 11/2001 |

OTHER PUBLICATIONS

Office Action, dated Dec. 22, 2006, for Chinese Patent Application No. 02127550.5.

Specification and Drawings for U.S. Appl. No. 09/986,425, "*Light Emitting Device*", Filing Date; Nov. 8, 2001, Inventor Shunpei Yamazaki.

Specification and Drawings for U.S. Appl. No. 10/147,294, "*luminescent Device and Process of Manufacturing the Same*", Filing Date May 20, 2002, Inventors: Satoshi Murakami et al.

Specification and Drawings for U.S. Appl. No. 09/580,485, "*Method for Manufacturing and Electro-Optical Device*", Filing Date May 30, 2000, Inventors: Shunpei Yamazaki et al.

Specification and Drawings for U.S. Appl. No. 09/748,166, "*Display Device*" Filing Date: Dec. 27, 2000, Inventor: Shunpei Yamazaki.

* cited by examiner

N-CHANNEL TYPE TFT     P-CHANNEL TYPE TFT

| N-CHANNEL TYPE TFT | P-CHANNEL TYPE TFT |

(■ : SAMPLE A   ▲ : SAMPLE B)

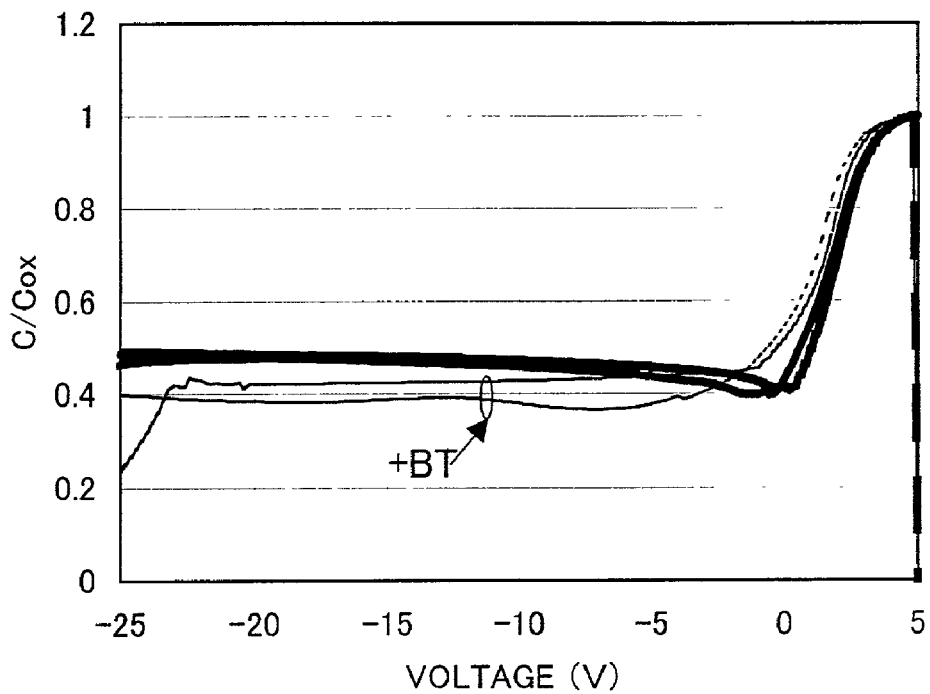
FIG. 13A (Si\SiO$_2$\SiN\Li-dip\Al)
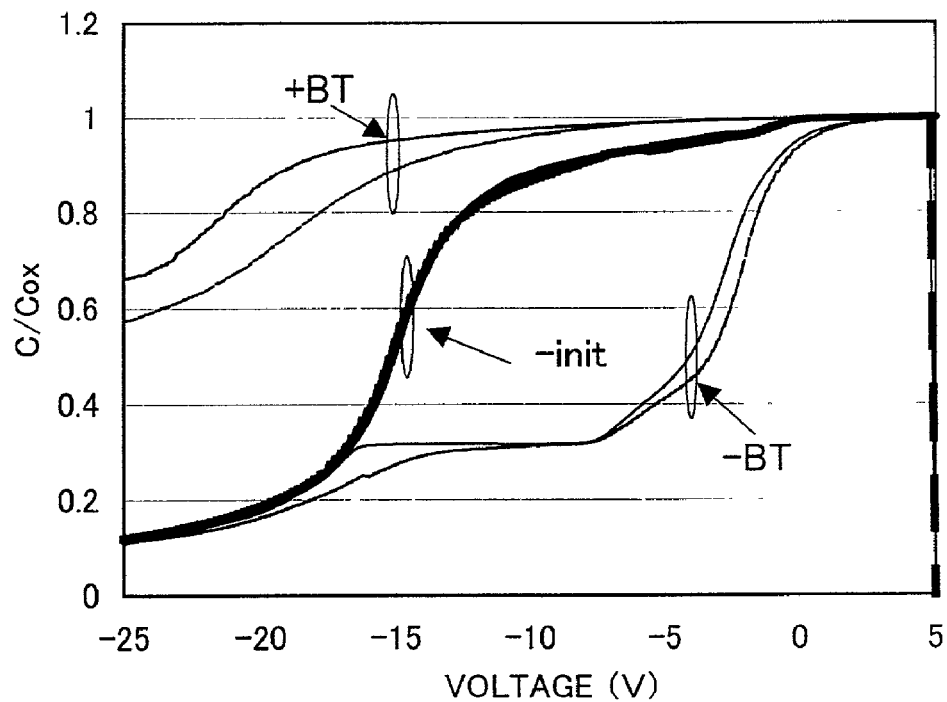
FIG. 13B (Si\SiO$_2$\Li-dip\Al)

LIGHT EMITTING DEVICE AND METHOD OF FABRICATING THE SAME

BACKGROUND OF THE INVENTION

1. Field of the Invention

The invention relates to a light emitting device having, on a substrate with insulating surfaces, a circuit comprising thin film transistors (referred below to as TFT) and a light emitting element between a pair of electrodes to be formed with a light emitting layer.

2. Related Art

Since TFT can be formed on a transparent substrate, application and development thereof on active matrix type picture display units have been positively promoted Because high mobility can be obtained with TFT, which makes use of a crystalline semiconductor film (typically, crystalline silicon film), picture display of high definition can be realized by integrating function circuits on the same substrate. In recent years, attention has been paid to a technique, in which TFT is constituted by means of a semiconductor thin film (having a thickness in the order of several to several hundreds nm) formed on a substrate having insulating surfaces. TFT has been widely applied on electron devices such as IC and electro-optical devices, and in particular, development thereof as a switching element for picture display units has been hastened.

Various applications making use of such picture display units are expected and in particular, attention has been paid to application on portable equipments. Among other things, a light emitting element has no need of back light as used in conventional liquid crystal displays. Accordingly, a light emitting element has a great advantage in that it can be fabricated to be extremely thin and lightweight.

A light emitting element is one of self-light emission type, in which a light emitting layer itself emits light upon application of electric field. A light emitting mechanism is said to consist of interposing a light emitting layer between electrodes to apply voltage thereon whereby electrons injected from a negative electrode and positive holes injected from a positive electrode rejoin at an emission center in the light emitting layer to form molecular excitons, which discharge energy to cause light emission when returning to a normal state.

With an active matrix type light emitting device having a light emitting element, a TFT is formed on a substrate and an interlayer insulating film is formed on the TFT. In addition, such interlayer insulating film can be formed by using an inorganic material containing silicon such as silicon oxide and silicon nitride, or an organic material such as organic resin materials, for example, polyimide, polyamide and acrylic resins.

A light emitting device means one comprising a positive electrode, a negative electrode, and a light emitting element constructed to have a layer, which is interposed between them and comprising a material, by which light emission through fluorescence or phosphorescence is obtained. In addition, a light emitting element referred to here and making use of an organic compound as a material for light emission is also called OLED (Organic Light Emitting Device).

In the case of flattening a substrate surface with an interlayer insulating film, formation of an interlayer insulating film by means of the spinning coating method is suitable. In performing a spinning coating, a solvent with the above silicon as a main component is used as an inorganic material. An interlayer insulating film formed by using a solvent with silicon as a main component possesses a property making oxygen or water impermeable therethrough, and the property exhibits itself when baked at sufficiently high temperature. Also, the film has a disadvantage that crack is generated when the film is increased in thickness.

Meanwhile, an interlayer insulating film formed by an organic material has an advantageous feature that while making oxygen permeable therethrough and making water permeable or absorbing water, it can be formed to have a thickness of 1 µm or more and its surface can be flattened under no influence from irregularities on a substrate. Also, the baking temperature is around 300° C. at the time of formation, and so the film can be also formed a substrate surface comprising an organic resin.

However, an organic material suited to the interlayer insulating film possesses a property making water vapor permeable therethrough and liable to absorb moisture. On the other hand, a light emitting layer, no matter whether it is low molecular or high molecular, has a disadvantage that it is extremely affected by oxygen and moisture to be deteriorated immediately. Further, alkali metal or alkaline earth metal is used for a positive electrode or a negative electrode of a light emitting element, and these are liable to be oxidized by oxygen. That is, moisture becomes responsible for deterioration of a light emitting element and failure such as dark spots or the like.

Silicon oxide, silicon nitride, or the like formed by the plasma CVD technique involves a need of heating a substrate at 300° C. or higher, and so is not suited to forming such silicon oxide, silicon nitride or the like on an organic resin film with no heat-resistance.

SUMMARY OF THE INVENTION

The invention solves the above problems, and is directed to preventing deterioration of a light emitting element caused by moisture and oxygen contained in an interlayer insulating film.

To solve the above problems, the invention provides a light emitting device, in which an interlayer insulating film comprising an organic material is formed on a TFT formed on an insulating surface, a light emitting element is provided on the interlayer insulating film between a pair of electrodes to be formed with a light emitting layer, and an inorganic insulating film with silicon and nitrogen as main components is formed between the interlayer insulating film and the light emitting element.

It is desired that a silicon oxynitride film and a silicon nitride film are applied as the inorganic insulating film, silicon has a rate of content of 25.0 atomic % or more and 35.0 atomic % or less, and nitrogen has a rate of content of 35.0 atomic % or more and 65.0 atomic % or less. A silicon oxide film has an inadequate blocking-resistance for moisture, and so there is a need of making the insulating film compact by application of a silicon oxynitride film and a silicon nitride film.

It is desired that a silicon oxynitride film and a silicon nitride film are applied as the inorganic insulating film, silicon has a rate of content of 25.0 atomic % or more and 40.0 atomic % or less, and nitrogen has a rate of content of 35.0 atomic % or more and 60.0 atomic % or less.

Also, a carbon film having a $SP^3$ bonding and containing hydrogen can be applied as another insulating film material. Diamond Like Carbon (DLC) is typical to posses a gas barrier property against oxygen, water vapor or the like and can form the insulating film with good adhesion to an interlayer insulating film comprising an organic material.

Further, the invention provides a method of fabricating a light emitting device, comprising the steps of forming an interlayer insulating film, which comprises an organic material, on a thin film transistor, using the sputtering method to form on the interlayer insulating film an inorganic insulating film, which contains silicon of a content of 25.0 atomic % or more and 35.0 atomic % or less and nitrogen of a content of 35.0 atomic % or more and 65.0 atomic % or less, and forming a light emitting element, which has a light emitting layer between a pair of electrodes, on the inorganic insulating film.

The invention provides a method of fabricating a light emitting device, comprising the steps of forming an interlayer insulating film, which comprises an organic material, on a thin film transistor, using the sputtering method to form on the interlayer insulating film an inorganic insulating film, which contains silicon of a content of 25.0 atomic % or more and 40.0 atomic % or less and nitrogen of a content of 35.0 atomic % or more and 60.0 atomic % or less, and forming a light emitting element, which has a light emitting layer between a pair of electrodes, on the inorganic insulating film.

As the inorganic insulating film, a carbon film having a $SP^3$ coupling and containing hydrogen may be formed by means of the sputtering method.

In constituting the invention, it is possible to apply to an interlayer insulating film comprising an organic material, an organic resin material of thermosetting or photo-curing type such as acrylic, polyimide, polyamide, polyimide amide, aramid and the like.

Methods of forming an inorganic insulating film include vapor phase deposition methods such as the sputtering method, reactive sputtering method, ion beam sputtering method, ECR (electron cyclotron resonance) sputtering method, ionic vapor deposition method or the like. Since these deposition methods in all cases are ones, in which atoms or molecules are physically adhered to a substrate, these atoms or molecules scarcely react with a interlayer insulating film being an underlying layer and comprising an organic material, and involve no fear of chemically deteriorating the layer. Also, the deposition methods has a feature in that a compact film can be formed even in the range of room temperature to 300° C., preferably, 150 to 250° C. And the deposition methods provides for a property of preventing permeation of oxygen and moisture.

In the case of deposition with the use of sputtering, it is possible to form an inorganic insulating film, which is favorable in light transmittance at 150° C. to 250° C. of substrate temperature and contains silicon and nitrogen as its main components. The provision of such inorganic insulating film makes it possible for a positive electrode, negative electrode and a light emitting material to be shielded from oxygen and moisture from an interlayer insulating film making use of an organic material and to be prevented from deterioration.

In addition, the inorganic insulating film containing silicon and nitrogen as its main components is formed by using a target having silicon as its main component and argon, nitrogen, oxygen, silicon oxide, hydrogen as sputtering gases in the deposition with sputtering. The film containing silicon and nitrogen as one of its main components is varied in composition ratio of nitrogen and oxygen in accordance with a gas flowrate at the time of deposition. In the specification of the present application, a film, in which a major part of a main component except silicon is nitrogen in the composition ratio, is described as a silicon nitride film. Also a film containing oxygen and nitrogen as a main component except silicon is described as a silicon oxynitride film.

Since a substrate is not heated to above 300° C. in the above process, the process can be applied to the case where a TFT is formed on an organic resin substrate.

BRIEF DESCRIPTION OF THE DRAWINGS

FIGS. 13A and 13B are views illustrating an effect of blocking Li by means of a silicon nitride film deposited in the sputtering method.

DETAILED DESCRIPTION OF THE PREFERRED EMBODIMENTS

Embodiment Mode 1

The invention accomplishes a light emitting device through a process, in which a TFT is formed on a surface of an insulating substrate, an interlayer insulating film comprising an organic material is formed thereon, and the sputtering method is used to form an inorganic insulating film such as a silicon nitride film and a silicon oxynitride film or a carbon film adjacent to the insulating film. Embodiment Mode 1 shows an example that a silicon nitride film or a silicon oxynitride film is used as the inorganic insulating film.

The interlayer insulating film comprising an organic material is formed by means of a coating method. Applied to the interlayer insulating film comprising an organic material is an organic resin material of thermosetting or photo-curing type such as acrylic, polyimide, polyamide, polyimide amide, aramid and the like. In addition, applicable as a low dielectric film having a lower dielectric constant than 3.8 are a silicon oxide film with the addition of fluorine, an organic SOG (Spin on Glass), HSQ (inorganic hydrogenation siloxane), HOSP (organic siloxane polymer), porous SOG and the like.

In order to form an inorganic insulating film by the sputtering method, silicon or silicon nitride or silicon oxynitride is used as a target comprising silicon. Results in examining methods of forming a silicon nitride film and a silicon oxynitride film will be indicated below.

Figure 1:
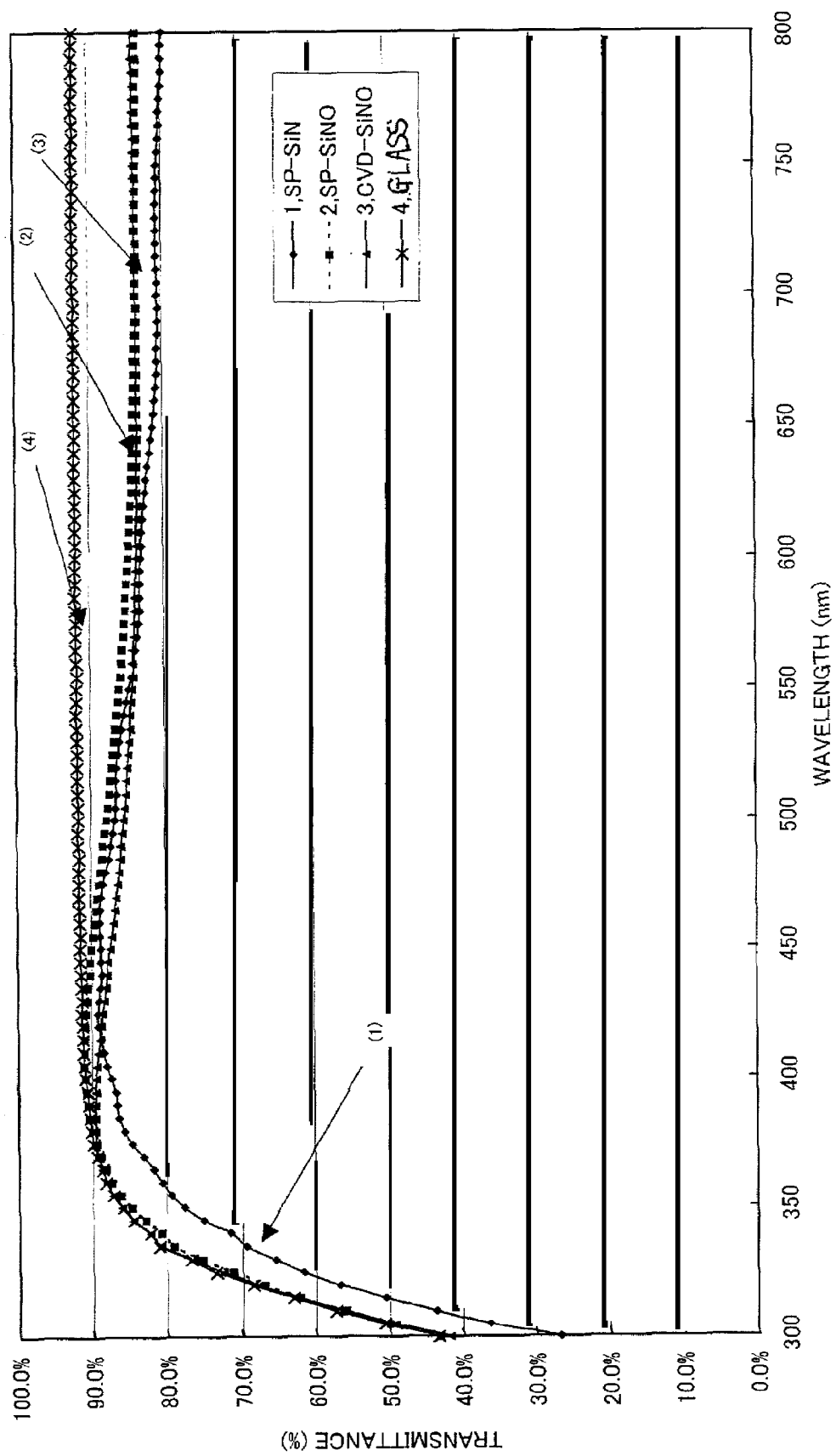
FIG. 1 is a view showing transmissivity of a silicon nitride film and a silicon oxynitride film, which are deposited by means of the sputtering method.

With the sputtering method, the silicon nitride film and the silicon oxynitride film were deposited on a glass substrate to have a film thickness of 100 nm, and measured with respect to transmissivity. Numbers (1) and (2) in FIG. 1 indicate results of measurement of the transmissivity characteristics. FIG. 1 also shows a transmissivity characteristics (3) of a silicon oxynitride film having a thickness of 100 nm and formed with the plasma CVD technique and a transmissivity characteristics (4) of glass. FIG. 1 shows that the silicon oxynitride film has a good transmissivity over the range of visible light. In order to enhance transmissivity, it is effective to add oxygen into the film at the time of deposition.

However, it was difficult to correlate an amount of oxygen in the film and transmissivity with each other. TABLE 1 shows results of comparison in composition of a silicon oxynitride film and a silicon nitride film deposited with the plasma CVD technique and the sputtering method.

TABLE 1

| film forming method | | SiON | | SiN | |
| --- | --- | --- | --- | --- | --- |
| | | CVD | sputtering | CVD | sputtering |
| temp. | (Tsub, ° C.) | 325 | 153 | 325 | 153 |
| composition | (atomic %) H | 23 | 17.2 | 20 | 1.5 |
| ratio | N | 33 | 42.2 | 47.7 | 59.5 |
| (by RBS) | O | 15 | 10 | 0* | 7 |
| | Si | 29 | 30.6 | 32.3 | 32 |

*less than the detection lower limit (O: 4 atomic %, N: 5 atomic %)

The silicon oxynitride film in TABLE 1 is formed by using silicon as a target, and deposition gases and flowrates are $N_2:H_2:N_2O=31:5:4$ sccm. Also, the deposition gas pressure of $N_2O$ was 0.4 Pa, a deposition power being 3 kW with an RF power source and a circular target having a radius of 12 inch. While the deposition gas had a flowrate of 4 sccm, a resulting film can be varied in properties by having oxygen flowing in place of $N_2O$ or varying a ratio of flowrate of respective deposition gases.

On the other hand, the silicon nitride film in TABLE 1 is formed by using silicon as a target, and deposition gases and flowrates are $N_2:Ar=20:20$ sccm. Also, a deposition gas pressure was 0.4 Pa, a deposition power being 0.8 kW with an RF power source and a circular target having a radius of 6 inch.

In TABLE 1, the same transmissivity is obtained even when the films are different in composition ratio. Meanwhile, since a silicon nitride film is superior to a silicon oxide film in a property of blocking oxygen and moisture, in the insulating film comprising silicon and nitrogen as its main components, high composition ratio of nitrogen in the film is desirable in some cases.

An oxygen content in a film containing silicon and nitrogen as its main components is believed to govern the transmissivity characteristics and the property of blocking oxygen and moisture. Hereupon, the sputtering method is used to deposit a film, which contains silicon and nitrogen as its main components, on an organic resin film, and the composition ratio in the film is determined conformed to the structure of an element. However, it has been ascertained from TABLE 1 that it is appropriate that silicon has a composition of 25.0 atomic % to 35.0 atomic % and nitrogen has a composition of 35.0 atomic % to 65.0 atomic %.

Deposition of the silicon oxynitride film was made in the order of 100 nm in thickness. Silicon was used as a target, and deposition gases and flowrates are $N_2:H_2:N_2O=31:5:4$ sccm. Also, a deposition gas pressure was 0.4 Pa, a deposition power being 3 kW with an RF power source and a circular target having a radius of 12 inch.

By forming a film mainly comprising silicon and nitrogen and having good light transmittance (e.g. silicon oxynitride, silicon nitride) on the interlayer insulating film, it makes possible for a positive electrode, negative electrode and a light emitting material to be shielded from oxygen and moisture from an interlayer insulating film comprising an organic material and to be prevented from deterioration.

Embodiment Mode 2

Embodiment Mode 2 shows that a silicon nitride film, which is formed by the different condition from the Embodiment Mode 1, is used as an inorganic insulating film.

According to the same process as the Embodiment Mode 1, TFT is formed over a surface of an insulating substrate, and an interlayer insulating film comprising an organic material is formed over the TFT, and then a silicon nitride film is formed thereon.

The silicon nitride is formed by the sputtering method. Silicon is used as a target, and deposition gases and flowrates are $N_2:Ar=20:0$ sccm. At this point, in order to maintain a constant temperature of the substrate, heated Ar is flowed on the surface of the substrate at 20 sccm. Also, a deposition gas pressure was 0.8 Pa, a deposition power being 3 kW with an RF power source and a circular target having a radius of 12 inch.

TABLE 2 shows the composition ratio of the silicon nitride film. According to TABLE 2, it is prefer that a content of silicon is 25.0 atomic % to 40.0 atomic % and a content of nitrogen is 35.0 atomic % to 60.0 atomic %.

TABLE 2

| | | | SiN |
| --- | --- | --- | --- |
| composition | (atomic %) | H | 0.6 |
| ratio | | N | 55.9 |
| (by RBS) | | O | 6* |
| | | Si | 37.3 |
| | | Ar | 0.2 |

*about detection lower limit

An explanation will be given below to an effect of a silicon nitride film.

Figure 11A:
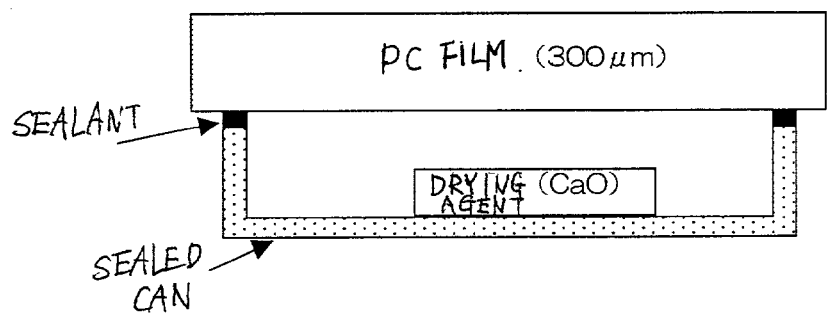
FIGS. 11A and 11B are views illustrating conditions, under which a silicon nitride film deposited by means of the sputtering method is measured with respect its effect of blocking moisture.
Figure 11B:
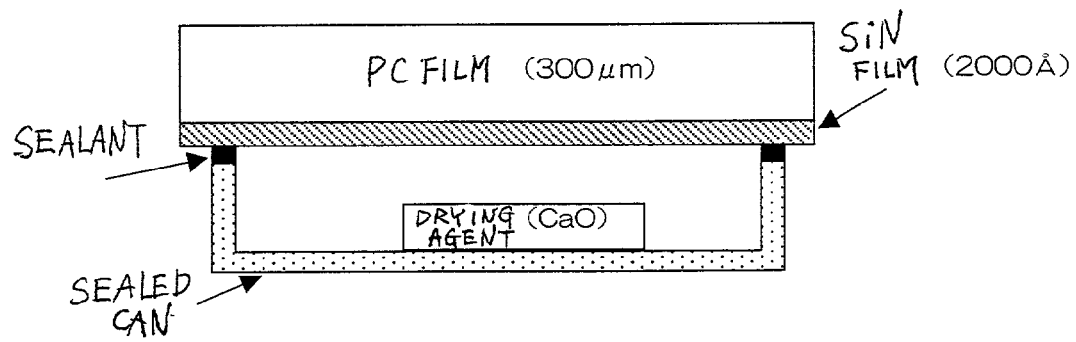
Figure 12A:
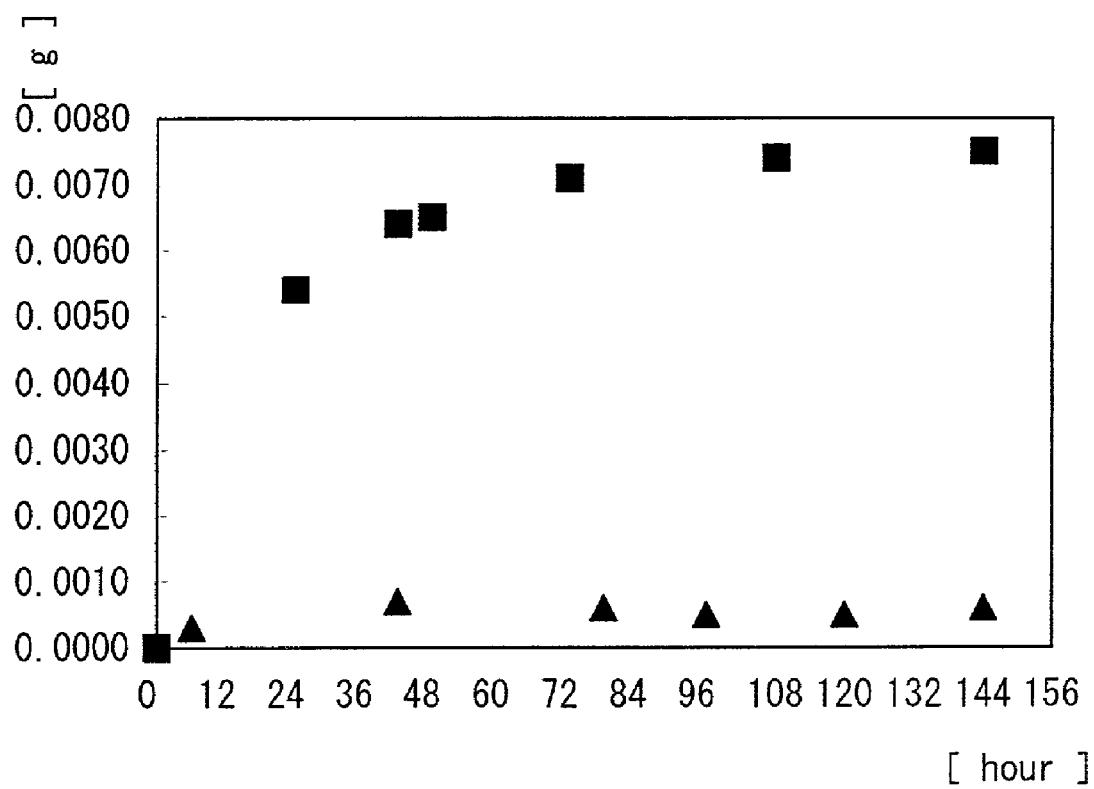
FIG. 12A is a view illustrating an effect of blocking moisture by means of a silicon nitride film deposited in the sputtering method.

A gas barrier property of the silicon nitride film was measured using sealed samples shown in FIGS. 11A and 11B. In the measurement, use was made of a sample A (FIG. 11A), in which a sealed can and a polycarbonate film (referred below to as PC) were sealed by means of a sealant, and a sample B (FIG. 11B), in which a sealed can and a PC film with a silicon nitride film deposited thereon were sealed by means of a sealant. In addition, CaO being a drying agent was installed in interiors of the sample A and the sample B. Changes in weight of the samples were measured when left under conditions of the atmospheric pressure and room temperature. Results of this are shown in FIG. 12.

It is found that the sample A (FIG. 11A) using only a PC increased in weight with time while the sample B (FIG. 11B)

using a PC with a silicon nitride film deposited thereon underwent a small change in weight, which revealed that the silicon nitride film blocked dispersion of vapor transmitted through the PC or moisture absorbed by the PC. Based on this knowledge, by forming a silicon nitride film of the present invention on an interlayer insulating film, which comprises an organic material and is formed over a TFT, vapor transmitted through the organic material or moisture absorbed by an organic resin can be suppressed from dispersing into a light emitting layer formed through the silicon nitride film. The same effect is also found in a silicon oxynitride film, in which a content of silicon was 25.0 atomic % or more and 35.0 atomic % or less and a content of nitrogen was 35.0 atomic % or more and 65.0 atomic % or less.

Further, the silicon nitride film was effective in blocking mobile ions such as those of Li or the like. FIGS. 13A and 13B show results of measurements of the MOS-CV characteristics of a TFT. FIG. 13A shows the MOS-CV characteristics of an element, in which an Al film was deposited after an element was immersed in a lithium acetate solution to have a film comprising Li formed on a silicon nitride film surface, which element was formed by forming a silicon oxide film on silicon by means of the thermal oxidation method and forming thereon a silicon nitride film by means of the sputtering method.

Meanwhile. FIG. 13B shows the MOS-CV characteristics of an element, in which after a silicon oxide film was formed on silicon by means of the thermal oxidation method, a film comprising Li is formed on the silicon oxide film by immersing it in a lithium acetate solution, and then an Al film was deposited.

In the measurements of the MOS-CV characteristics, a+BT test was carried out, in which voltage of 1.7 MV and heating at 150° C. were simultaneously applied on a TFT being an object for estimation for an hour, and a–BT test was carried out, in which voltage of –1.7 MV and heating at 150° C. were simultaneously applied on the TFT. It is seen from FIG. 13B that Li in the silicon oxide film moved between a silicon surface and Al in the BT tests in the light of the fact that the characteristics shifts towards a plus voltage from a voltage-capacity curve in the initial stage at the time of the –BT test, and towards a minus voltage from a voltage-capacity curve in the initial stage at the time of the +BT test. Meanwhile, it is seen from FIG. 13A that Li did not move between the silicon surface and Al in the light of the fact that a voltage-capacity curve at the time of the +BT test does not substantially change from the voltage-capacity curve in the initial stage, and that the silicon nitride film impeded movements of Li in the silicon oxide film. Owing to this, an EL element with a silicon nitride film in the present invention formed on an organic material on the TFT can suppress dispersion and movement of mobile ions of Li or the like, which is used for a negative electrode material of the EL element, toward the TFT and instability in the performance of the TFT caused by variation in the threshold value of the TFT. The same effect is found in a silicon oxynitride film, in which a content of silicon was 25.0 atomic % or more and 35.0 atomic % or less and a content of nitrogen was 35.0 atomic % or more and 65.0 atomic % or more.

Embodiment Mode 3

Embodiment Mode 3 shows an example that an interlayer insulating film is formed over a TFT formed on a surface of an insulating substrate, and then a carbon film is formed in contact with the interlayer insulating film by sputtering method.

A DLC film is typically applied to a carbon film. The DLC film possesses $Sp^3$ coupling as a coupling between carbons in terms of short-distance order but is structured in the form of amorphous in macroscopic aspect. The DLC film has such a composition that a content of carbon is 95 to 70 atomic % and a content of hydrogen is 5 to 30 atomic %, and so is very hard and excellent in insulation. Such a DLC film is characteristic of a low gas transmissivity for vapor and oxygen, and so can be enhanced in the property of blocking oxygen and moisture. In this case, the DLC film is formed to have a thickness of 5 to 500 nm. Also, it is known that the film has a hardness of 15 to 25 GPa in measurements by means of a microhardness meter.

Further, a DLC film can be formed to have a good adherence even without heating a substrate, in which an interlayer insulating film comprising an organic material is formed, and a TFT. With the sputtering method, a compact and hard film can be formed making use of ion bombardment to some extent.

According to methods described in Embodiment Modes 1 to 3, by forming an interlayer insulating film or a carbon film on the interlayer insulating film comprising an organic material in this manner, it is possible to prevent oxygen and moisture from entering a light emitting element from a side of the interlayer insulating film to prevent deterioration of the light emitting element. Also, it is possible to prevent mobile ions from being dispersed toward the TFT and to suppress variation in the threshold value of the TFT. From the above, it becomes possible to suppress generation of dark spots and deterioration of luminance in a light emitting device and to increase reliability in a TFT used in light emitting devices.

In the following embodiment, an example is illustrated a layered structure used in TFT process, in which acrylic is used for the interlayer insulating film comprising an organic material and a silicon oxynitride film a silicon nitride film is used for the inorganic insulating film.

EMBODIMENT

Embodiment 1

A detailed explanation will be given by way of the following embodiment. Here, an example, in which a TFT substrate used for a light emitting device is formed.

Figure 2A:
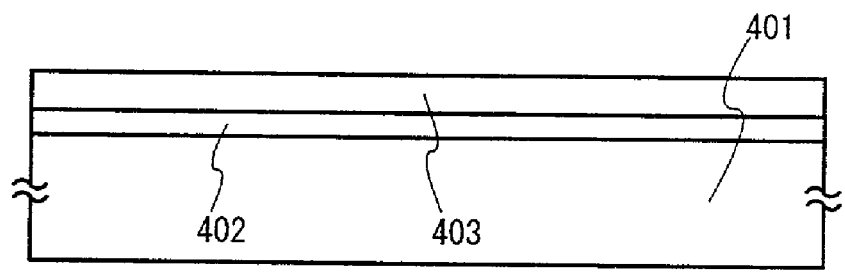
FIGS. 2A to 2C are views illustrating a method of fabricating a semiconductor device used in a light emitting element in the invention.

In FIG. 2A, a glass substrate or quartz substrate is used for a substrate 401. In the case of using a glass substrate, a substrate film 402 comprising an insulating film is formed on a substrate surface to prevent dispersion of impurities from the substrate.

Subsequently, a semiconductor layer 403 having a thickness of 25 to 80 nm (preferably, 30 to 60 nm) and an amorphous structure is formed by means of known methods such as the plasma CVD technique and the sputtering method, and a process of crystallization is implemented to fabricate a crystalline semiconductor layer from an amorphous semiconductor layer.

The laser annealing method and the thermal annealing method (method of crystal growth from solid phase) or the rapid thermal annealing method (RTA method) can be applied as a method of crystallization. In the case of using the laser annealing method, when the semiconductor layer has a large film thickness, damage to the substrate increase since thermal capacity at the time of laser irradiation increases. So the film thickness is preferably thin.

Also, a catalyst may be made use of as a method for crystallization of the semiconductor layer. Nickel (Ni) is effective as an example of a catalyst element.

At this time, the spin coating method for coating a water solution by way of rotation of the substrate with a spinner is used to form a layer containing a catalyst element. Then a furnace annealing furnace is used to perform thermal annealing at 550 to 600° C. for one to eight hours in a nitrogen atmosphere. In the above processes, a crystalline semiconductor layer comprising a crystalline silicon film can be obtained.

Also, measures for removing the catalyst element include measures utilizing a gettering action produced by phosphorus (P). At this time, P is added in doping to a region, in which Ni is to be segregated. In order to favorably perform gettering with P, $1.5 \times 10^{20}$ atomic/cm$^3$ or more is preferable. In addition to phosphorus (P), it is possible to make use of measures, which utilize a gettering action produced by argon (Ar). For example, argon (Ar) of $1 \times 10^{20}$ atomic/cm$^3$ or more is added to a region, in which the catalyst element is to be segregated. Measures for addition of argon (Ar) include, in addition to accelerated impregnation by way of doping, a method, in which argon (Ar) is used as a sputtering gas to form the region by means of sputtering deposition of silicon. The region, to which argon (Ar) is added, may contain phosphorus (P). After formation of the region, in which Ni is to be segregated, thermal annealing can be used for gettering of the catalyst element to the region, in which Ni is to be segregated.

Figure 2B:
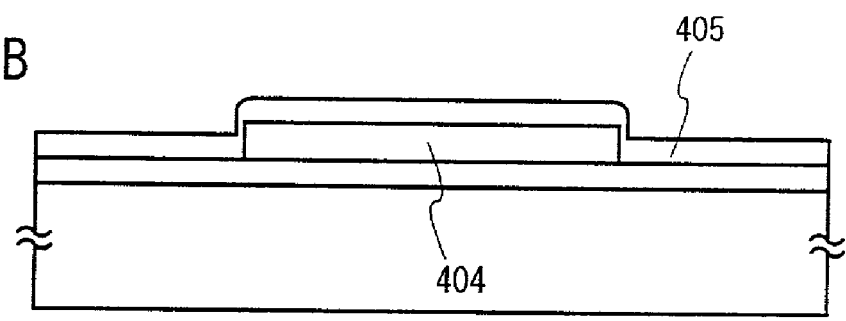

Then the photolithographic technique is used to form a resist pattern on the crystalline semiconductor layer and dry etching is used to segment the crystalline semiconductor layer in an island-shaped manner to form an island-shaped semiconductor layer 404 as shown in FIG. 2B. With a view to controlling a threshold voltage (Vth) of the TFT on the island-shaped semiconductor layer 404, an impurity element for application of p-type may be added to an entire surface of the island-shaped semiconductor layer in concentration of around $1 \times 10^{16}$ to $5 \times 10^{17}$ atomic/cm$^3$.

With the use of the plasma CVD technique or the sputtering method, an insulating film containing silicon is used to form a gate insulating film 405 having a film thickness of 40 to 150 nm. When the plasma CVD technique and the sputtering method are used in this embodiment, favorable characteristics can be obtained by processing a surface of the semiconductor layer in a $H_2$ atmosphere prior to deposition.

Figure 2C:
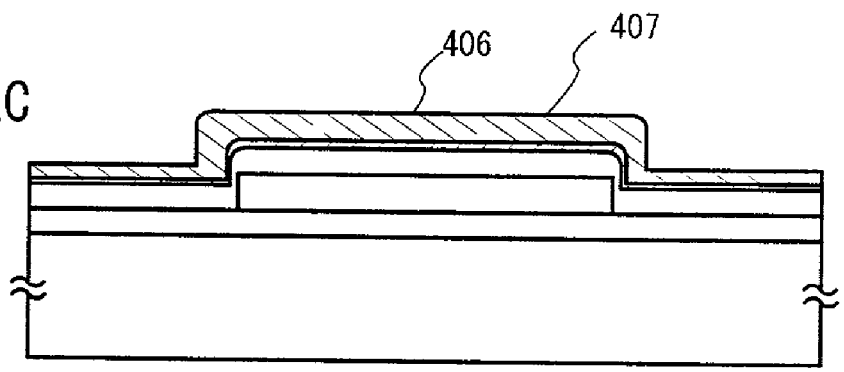

Then a tantalum nitride film 406 and a tungsten film 407 for formation of a gate electrode on the gate insulating film are formed as shown in FIG. 2C. In this embodiment the tantalum nitride is formed to have a thickness of 30 nm, and tungsten is formed to have a thickness of 300 to 400 nm. The tantalum nitride film is formed by means of the sputtering method, in which a target of Ta is subjected to sputtering with Ar and $N_2$. When a tungsten film is to be formed, it is formed by means of the sputtering method with tungsten being a target.

Subsequently, a resist is used to form a mask 501, which is subjected to a first etching processing for formation of a gate electrode. The processing is illustrated with reference to FIGS. 3A to 3C. While no restrictions are imposed on the etching method, the ICP (Inductivity Coupled Plasma) etching method is preferably used, in which plasma is generated by mixing $CF_4$ and $Cl_2$ with each other for an etching gas and applying an RF (13.56 MHZ) power of 500 W to a coil type electrode at 0.5 to 2 Pa, preferably, 1 Pa. An RF (13.56 MHZ) power of 100 W is applied to a substrate side (sample stage) to apply a substantially negative self-bias voltage. In the case where $CF_4$ and $Cl_2$ are mixed with each other, the tungsten film 502 and the tantalum nitride film 503 are subjected to etching to the same extent.

Figure 3A:
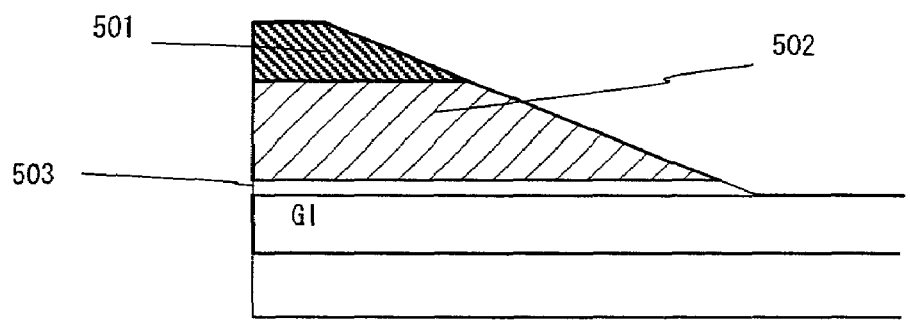
FIGS. 3A to 3C are views illustrating a method of fabricating a semiconductor device used in a light emitting element in the invention.

Under the above etching conditions, a resist makes a configuration of the mask appropriate whereby ends of the tantalum nitride film 503 and the tungsten film 502 are tapered at an angle of 15 to 45° by virtue of the effect of the bias voltage applied to the substrate side. In order to perform etching without residue on the gate insulating film, it is preferable to increase an etching time at a rate of around 10 to 20%. (FIG. 3A)

Then a second etching processing is carried out. In a similar manner to the above, the ICP etching method is used, in which plasma is generated by mixing $CF_4$, $Cl_2$ and $O_2$ with one another for an etching gas and applying an RF (13.56 MHZ) power of 500 W to a coil type electrode at 1 Pa. An RF (13.56 MHZ) power of 50 W is applied to the substrate side (sample stage) to apply a low self-bias voltage as compared with that in the first etching processing. Under these conditions, the tungsten film is subjected to anisotropic etching and at the same time a region 505 not covered by the tantalum nitride film 504 is further subjected to etching in a thickness of around 20 to 50 nm to provide a thinned region. Thereafter, the tantalum nitride film constituting a first conductive layer is subjected to etching at a lower speed than that in the above etching and then a conductive layer is formed as shown in FIG. 3C.

Figure 3B:
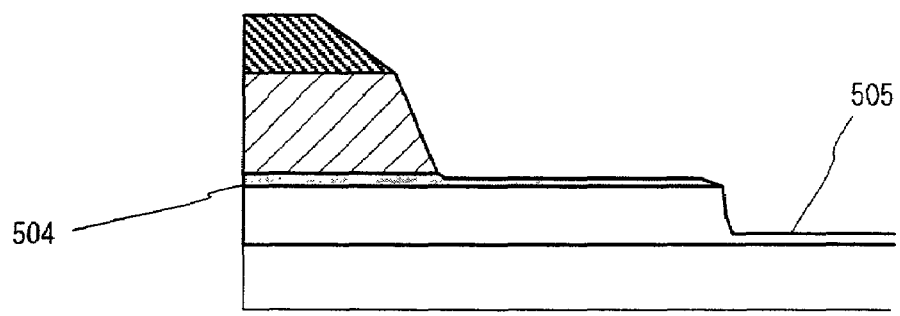

In this embodiment, while tantalum nitride and tungsten are listed as materials for the gate electrode, other conductive materials may used provided that a configuration shown in FIG. 3B is obtained. For example, two kinds of metals or alloys, which are different in etching rate, may be used as selected from Ta, Mo, WN, crystalline silicon, Ti, Nb or 4A to 6A groups.

Figure 3C:
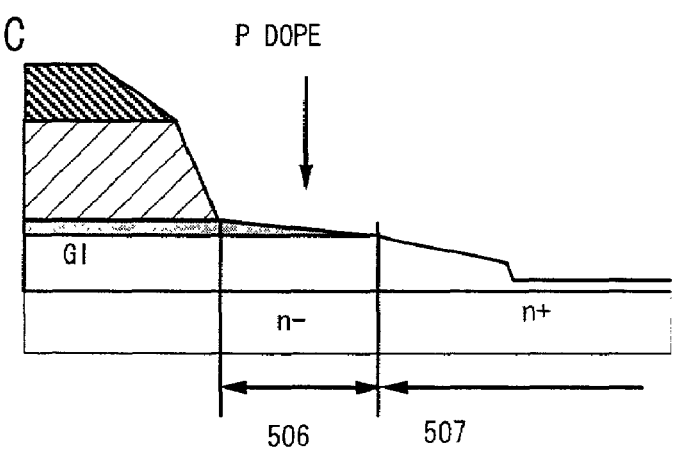
Figure 4A:
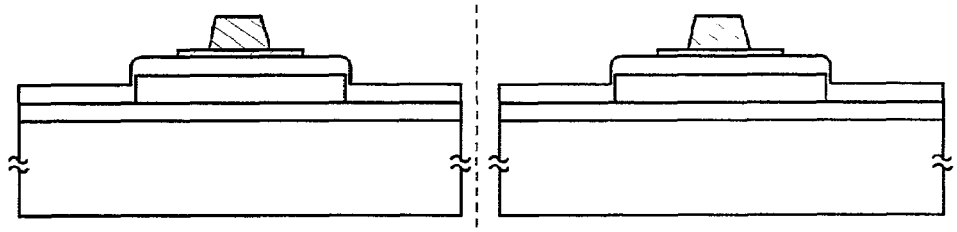
FIGS. 4A to 4D are views illustrating a method of fabricating a semiconductor device used in a light emitting element in the invention.
Figure 4B:
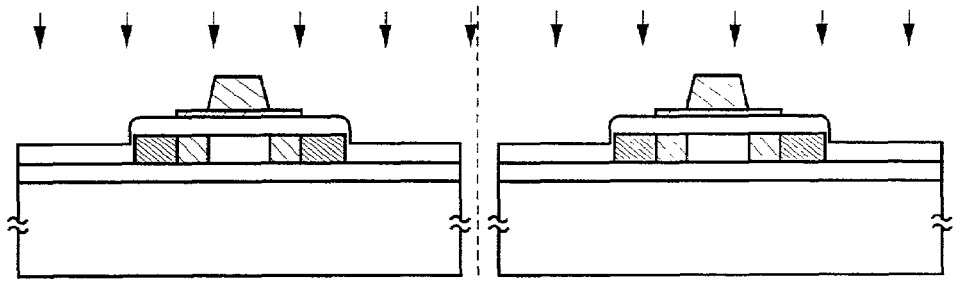

Then a first impurity adding method is used to make addition of P as shown in FIG. 3C. Doping may be made with the ion doping method or the ion implantation method. In this embodiment, the gate insulating film has a film thickness of 90 nm, and conditions in the ion doping method include an acceleration voltage of 80 kV and a dose quantity of $1.5 \times 10^{15}$ atomic/cm$^2$. Thus a first impurity region 506 and a second impurity region 507 are formed in a self-aligned manner. P of around $2.0 \times 10^{18}$ atomic/cm$^3$ is added to the first impurity region 506. P of around $1.7 \times 10^{20}$ atomic/cm$^3$ is added to the second impurity region 507. (FIG. 4B)

The first impurity region 506 thus formed is a LDD region to be able to improve reliability. Since that electric field, at which the TFT is driven, is relieved in accordance with a thickness of the gate insulating film and a length of the first impurity region in a source-drain direction, and there is an optimum value for lowering of electron temperature of a carrier in the semiconductor layer, concentration should be examined conformed to the TFT.

Figure 4C:
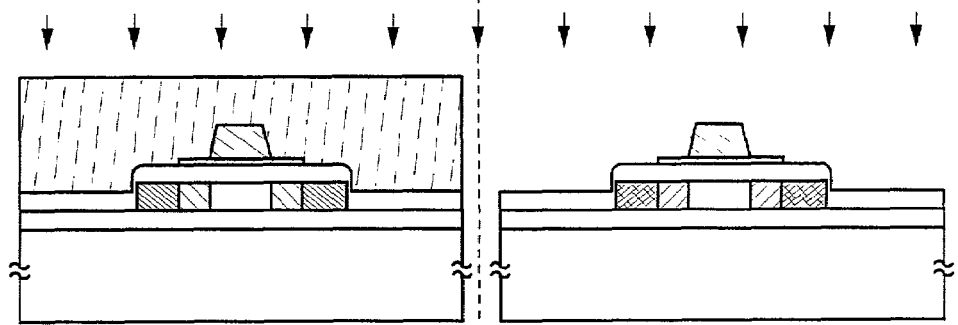
Figure 4D:
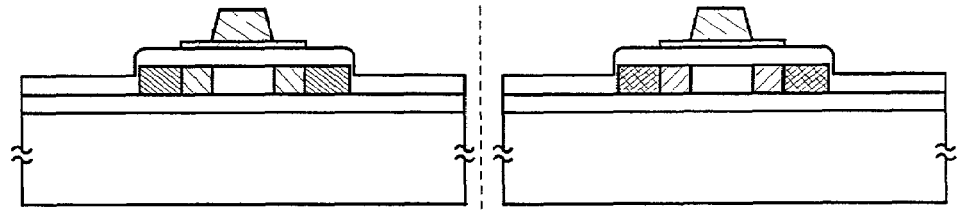

Subsequently, a resist mask is formed to cover an entire surface of the island-shaped semiconductor layer, which forms a n-channel type TFT shown in FIG. 4C. When a resist is formed to have a thickness of 500 nm, an amount of the resist reaching the element upon addition of impurities is small as compared with that added to the first impurity region. In this embodiment, the resist is formed to have a thickness of 1000 nm.

Then a high-concentration p-type impurity region, which defines a source region and a drain region, is formed on the island-shaped semiconductor layer, which forms a p-channel type TFT. Here, an impurity element applying a p-type is added as the gate electrode mask to form a high-concentration p-type impurity region in a self-aligned manner. The impurity region as formed is formed by means of the ion doping method making use of diborane ($B_2H_6$). Further, the high-concentration p-type impurity region not overlapping the gate electrode is made to have a boron concentration of $3\times10^{20}$ to $3\times10^{21}$ atomic/$cm^3$. Also, since an impurity element is added through the gate insulating film and the first gate electrode to an impurity region that overlaps the first gate electrode, the impurity region is formed substantially as a low-concentration p-type impurity region to have a concentration of $1.5\times10^{19}$ atomic/$cm^3$ or more.

In a previous process, P is added to the high-concentration p-type impurity region and the low-concentration p-type impurity region such that the high-concentration p-type impurity region contains P in concentration of $1\times10^{20}$ to $1\times10^{21}$ atomic/$cm^3$ and the low-concentration p-type impurity region contains P in concentration of $1\times10^{16}$ to $1\times10^{19}$ atomic/$cm^3$, but there has never been caused any problem since a concentration of boron (B) added in this process is made 1.5 to 3 times the concentration of P to have the regions functioning as a source region and a drain region of a p-channel type TFT.

Figure 5A:
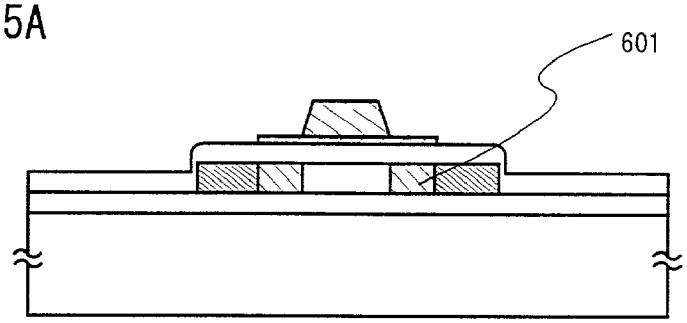
FIGS. 5A to 5D are views illustrating a method of fabricating a semiconductor device used in a light emitting element in the invention.
Figure 5B:
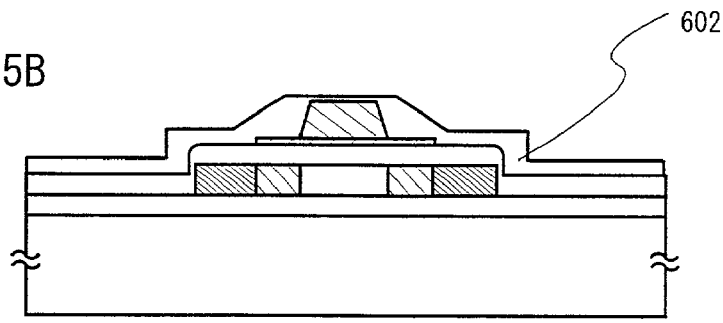

FIG. 5A shows a cross section of a TFT, in which the LDD region 601 is formed. In FIGS. 5A to 5D, a n-channel type TFT and a p-channel type TFT are shown in the same figure for the sake of simplicity. Thereafter, the sputtering method or the plasma CVD technique is used to form a gate electrode and a first interlayer insulating film 602 on a gate insulating film as shown in FIG. 5B. The first interlayer insulating film 602 may be formed from a silicon oxide film, silicon oxynitride film, silicon nitride film, or a laminated film comprising a combination thereof. Here, plasma CVD is used to form a silicon oxynitride film at a thickness of 500 nm.

Thereafter, a process is implemented, in which an impurity element added in a suitable concentration and imparting a n-type or p-type is activated. While heat treatment is carried out at 550° C. for four hours in this embodiment, the laser annealing method or the RTA method is applicable in the case where a substrate possesses no heat-resistance.

Subsequent to the activation process, heat treatment is carried out at 300 to 450° C. for one to twelve hours in an atmosphere containing hydrogen in a rate of 3 to 100% to hydrogenate the island-shaped semiconductor layer. As other measures for hydrogenation, plasma hydrogenation (utilization of hydrogen excited by plasma) may be performed.

Figure 5C:
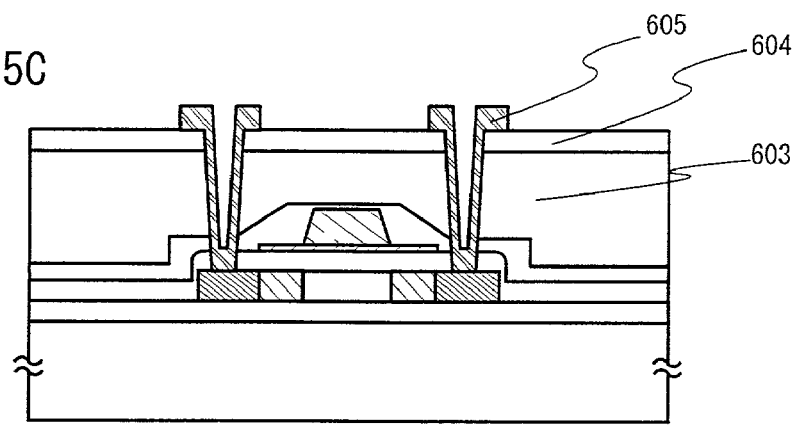
Figure 5D:
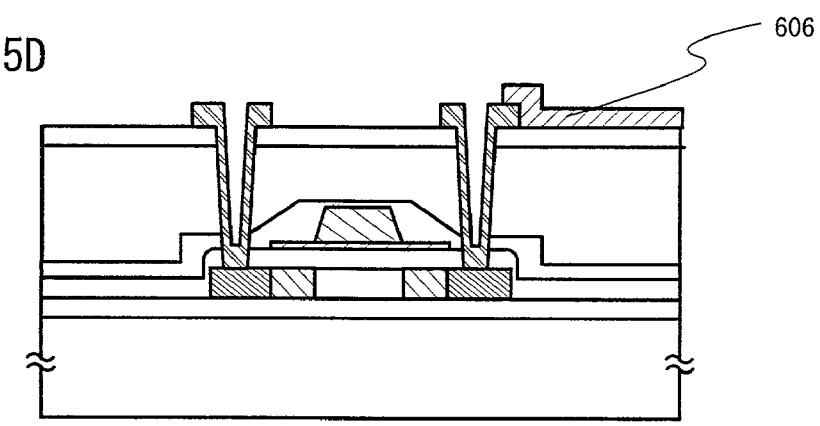

When the processes for activation and hydrogenation are terminated, a second interlayer insulating film 603 comprising an organic material is formed as shown in FIG. 5c to have an average thickness of 1.0 to 2.0 μm. Polyimide, acrylic, polyanide, polyimide amide, BCB (benzocyclobutene) can be used as the organic material.

The surface can be favorably flattened by forming the second interlayer insulating film 603 from an organic material in this manner. Also, since the organic material 603 is generally low in dielectric constant, it is possible to decrease parasitic capacitance. Since the organic material is hygroscopic and so not suitable as a protective film, as in this embodiment, it is preferable to combine the material with a silicon oxide film, silicon oxynitride film, silicon nitride film, or the like formed as the first interlayer insulating film 602.

Thereafter, a silicon oxide film, silicon nitride film, or a silicon oxynitride film is deposited to form a third interlayer insulating film 604 by means of the sputtering method. In this embodiment, a silicon nitride film is formed on the third interlayer insulating film to have a thickness of around 100 nm. Silicon is used as a target with deposition gas and the flowrates being $N_2$:$H_2$:$N_2O$=31:5:4 sccm. Also, a deposition gas pressure is 0.4 Pa, a deposition power being 3 kW from an RF power source with the use of a circular-shaped target having a radius of 12 inch.

While the deposition gas and its flowrate are $N_2O$=4 sccm, transmissivity is preferably enhanced by increasing the $N_2O$ flowrate to make a composition ratio of oxygen in the film large in the case where the range of deposition conditions is sufficiently wide relative to deterioration caused by moisture or oxygen. Also, while the third interlayer insulating film is formed from a silicon oxynitride film in this embodiment, it is preferable to use a silicon nitride film in place of a silicon oxynitride film in the case where a material liable to be made considerably susceptible to deterioration by moisture or oxygen is used as a light emitting material. Conditions of deposition at this time are such that silicon is used as a target, a deposition gas and its flowrate being $N_2$ and 20 sccm. Also, a deposition gas pressure is 0.8 Pa, a deposition power being 3 kW from an RF power source with the use of a circular-shaped target having a radius of 12 inch.

Thereafter, a contact hole leading to a source region or a drain region formed in the respective island-shaped semiconductor layers is formed. The contact hole is formed by means of the dry etching method. In this case, the third interlayer insulating film 604 is subjected to etching with an etching gas comprising $CF_4$, $O_2$, and then using a mixed gas of $CF_4$, $O_2$, He as an etching gas, the second interlayer insulating film 603 comprising an organic material is first subjected to etching. Subsequently, the first interlayer insulating film 602 is subjected to etching with an etching gas comprising $CF_4$, $O_2$, and then the gate insulating film is subjected to etching.

Then the sputtering method or the vacuum deposition method is used to form a conductive metallic film, a resist pattern is formed, and a source wiring and a drain wiring 605 are formed by means of etching. In this embodiment, a four-layered structure having an entire thickness of 500 nm is provided by forming a Ti film, forming thereon a titanium nitride film, forming Al, and further forming a titanium film or tungsten film.

Thereafter, a transparent conductive film 606 is formed on an entire surface, and pixel electrodes are formed by means of the patterning treatment or etching treatment. The pixel electrodes are formed on the second interlayer insulating film comprising an organic material to provide portions overlapping a drain wiring of a pixel TFT to create electric connections.

Indium oxide ($In_2O_3$), indium oxide stannic oxide alloy ($In_2O_3$—$SnO_2$; ITO) or the like can be formed by means of the sputtering method, the vacuum deposition method or the like to be used as a material for the transparent conductive film 606. Etching treatment of such material is performed with a hydrochloric acid based solution. When ITO is formed, the etching treatment can be performed with a hydrofluoric acid based solution in the case where the substrate should not be crystallized at room temperature by having hydrogen or water flowing as a sputtering gas. In this case, transmissivity can be enhanced by performing heat treatment of the substrate at 160 to 300° C. for an hour or longer to crystallize ITO in a subsequent process.

A TFT substrate for forming a light emitting device is finished in the above-mentioned processes.

Embodiment 2

An explanation will be given below to a process of fabricating a TFT on a plastic substrate in this embodiment with reference to FIGS. 10A to 10E.

First, a plastic substrate 201 comprising an organic material is prepared. In this embodiment, the substrate 201 comprising polyimide is used. The substrate comprising polyimide is heat-resistible at about 399° C. and is not transparent but brown-colored. Then a substrate insulating film 202 is formed on the substrate 201. The substrate insulating film is not specifically limitative in a deposition method provided that the method is implemented in a temperature range, in which the plastic substrate is not deformed, preferably a temperature range not exceeding 300° C., and here the sputtering method is used. With the sputtering method, deposition is effected in an atmosphere, in which a sputtering gas does not contain hydrogen, and thus a quantity of hydrogen in the film is 5 atomic % or less.

Then an amorphous semiconductor film is formed and crystallized by means of laser irradiation to fabricate a crystalline semiconductor film. The amorphous semiconductor film is not specifically limitative in a deposition method provided that a process temperature is in a temperature range, in which the plastic substrate is not deformed, preferably a temperature range not exceeding 300° C., and here the sputtering method is used. Subsequently, the crystalline semiconductor film is patterned in a desired configuration to form a semiconductor layer 203.

Figure 10A:
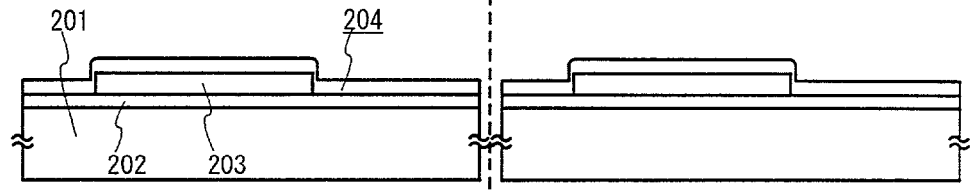
FIGS. 10A to 10E are views illustrating a method of fabricating a semiconductor device used in a light emitting element in the invention.

Then a gate insulating film 204 is formed to cover the semiconductor layer 203. The gate insulating film is deposited by means of the sputtering method (FIG. 10A). At this time, deposition is implemented by sputtering a silicon target with the use of argon, oxygen, hydrogen and $N_2O$ as a sputtering gas.

Figure 10B:
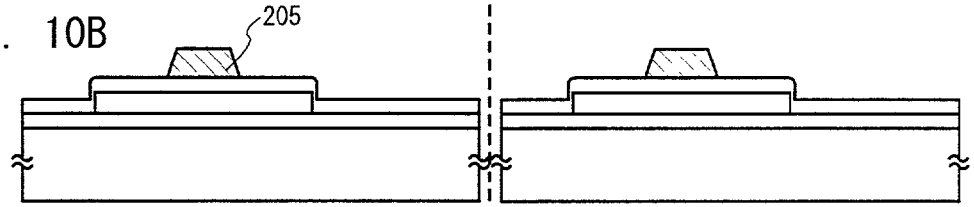

Then a gate electrode 205 is formed (FIG. 10B). The gate electrode 205 may be formed from an element selected from Ta, W, Ti, Mo, Al, Cu, Cr and Nd, or an alloy material containing the element as its main component, or a chemical compound material. Also, a semiconductor film typified by a multi-crystal silicon film, in which an impurity element such as phosphorus or the like is doped, may be used. Also, an AgPdCu alloy may be used.

Figure 10C:
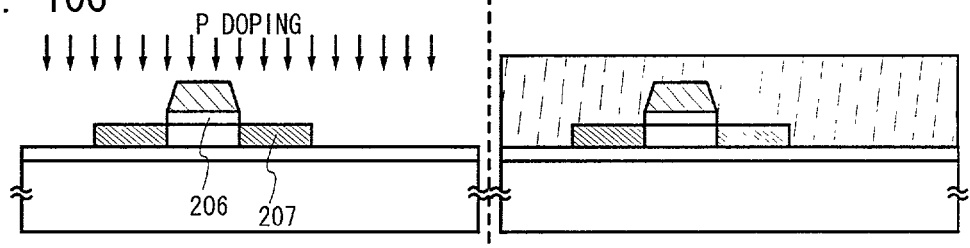

Then the gate insulating film is subjected to etching in a self-aligned manner with the gate electrode as a mask to form a gate insulating film 206, and after the semiconductor layer is partially exposed, an impurity element for imparting of n-type. phosphorus here is doped to form an impurity region 207 (FIG. 10C). At this time, a resist is formed on the p-type TFT and peeled off after the addition of an impurity element for imparting of p-type.

Figure 10D:
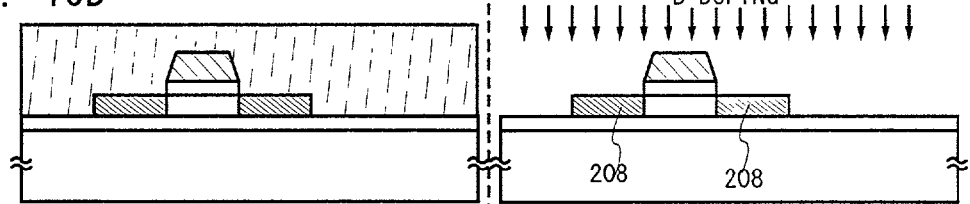

Subsequently the gate insulating film is subjected to etching in a self-aligned manner with the gate electrode as a mask to form a gate insulating film, and after the semiconductor layer is partially exposed, an impurity element for imparting of p-type, boron here is doped to form an impurity region 208 (FIG. 10D). At this time, a resist is formed on the n-type TFT and peeled off after the addition of an impurity element for imparting of p-type.

While doping is implemented in the embodiment after the gate insulating film is subjected to etching, doping may be implemented through the gate insulating film after the gate electrode is formed. In this case, the impurity element is passed through the gate insulating film and doped in a self-aligned manner with the gate electrode as a mask.

Then an interlayer insulating film 210a comprising acrylic and an interlayer insulating film 210b containing silicon as its main component are formed in the same manner as in the embodiment 1. At this time, a substrate temperature does not exceed 300° C. and so the substrate is not deformed.

Subsequently, a contact hole leading to a source region or a drain region is formed, and then a source wiring 211 connected electrically to the source region and pixel electrodes 212 connected electrically to the drain region are formed.

Subsequently, hydrogenation treatment is performed in order to improve the TFT characteristics. As such hydrogenation, heat treatment (300° C., one hour) is performed in a hydrogen atmosphere or plasma hydrogenation is performed at low temperature.

Figure 10E:
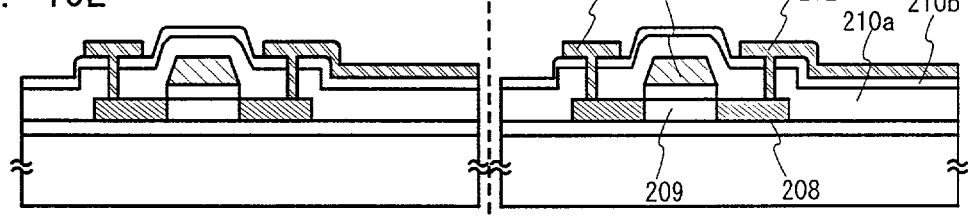

In the above fabricating processes, a top-gate type TFT formed on a plastic substrate used in light emitting devices is completed in a temperature range, in which the plastic substrate comprising an organic substance is not deformed, preferably at a process temperature equal to or lower than 300° C. (FIG. 10E).

Embodiment 3

An example of fabricating an EL (electro-luminescence) display device using the semiconductor device of Embodiment 1 will be explained in this embodiment. Note that FIG. 6A is a top view of an EL display device using the present invention, and FIG. 6B is a cross sectional view thereof.

Figure 6A:
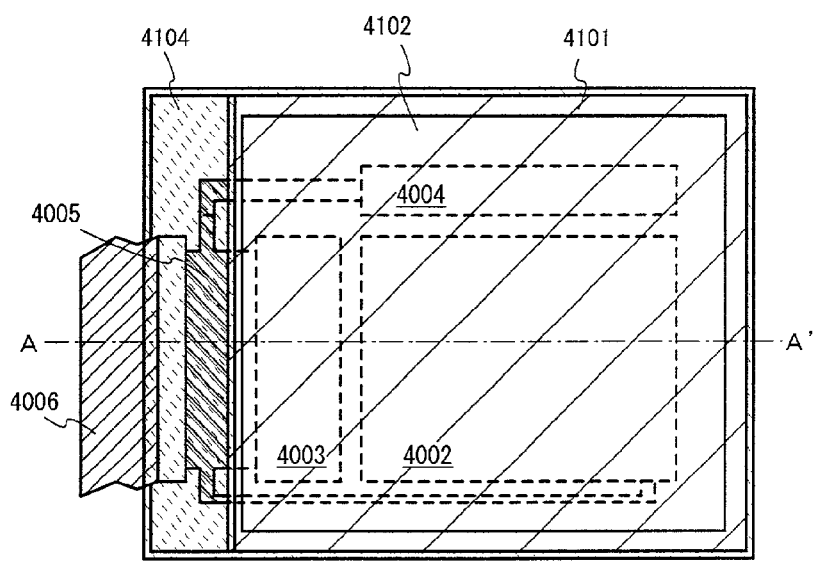
FIGS. 6A and 6B are views illustrating an EL display device, for which the invention is used.

In FIG. 6A, reference numeral 4001 denotes a substrate, 4002 denotes a pixel portion, 4003 denotes a source side driving circuit, 4004 denotes a gate side driving circuit. The driving circuits are connected to external equipment, through an FPC (flexible printed circuit) 4006 via a wiring 4005.

At this time, a first sealing material 4101, a covering material 4102, a filler material 4103 and a second sealing material 4104 are provided so as to enclose the pixel portion 4002, the source side driving circuit 4003, and the gate side driving circuit 4004.

Figure 6B:
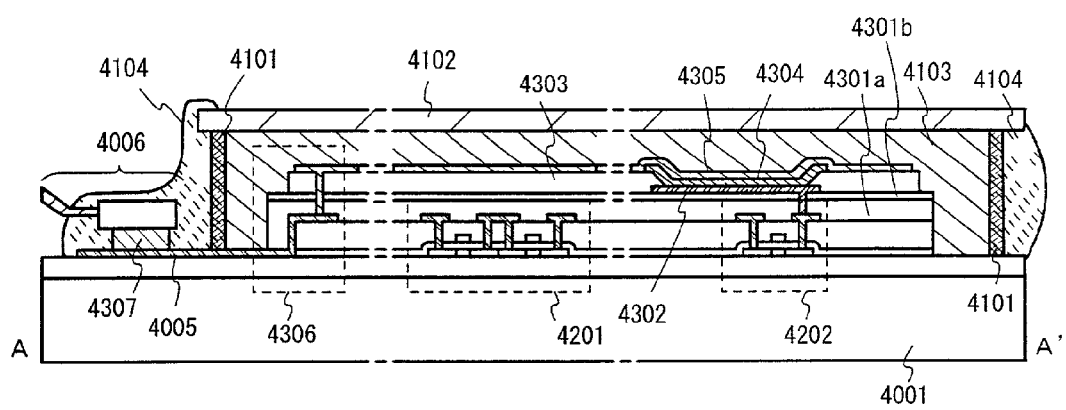

A cross sectional diagram of FIG. 6 cut along the line A-A' is shown in FIG. 6B. On the substrate 4001, a driver TFT 4201 included in the source side driving circuit 4003 (an n-channel TFT and a p-channel TFT are shown here) and a current control TFT 4202 included in the pixel portion 4002 (a TFT for controlling the current flowing to a light emitting element is shown here) are formed.

In this embodiment, a p-channel TFT and an n-channel TFT fabricated by a known method are used for the driving TFT 4201 and a p-channel TFT fabricated by a known method used for a current control TFT 4202. Further, the pixel portion 4002 is provided the storage capacitor (not shown in figure) connected gate electrode of the current control TFT 4202.

An interlayer insulating film (leveling film) 4301a made from a resin material and an interlayer insulating film 4301b consists of silicon and nitride as principle ingredients, which characterize the present invention, are formed on the driver TFT 4201 and the pixel TFT 4202, and a pixel electrode (anode) 4302 electrically connected to a drain of the pixel TFT 4202 thereon. The pixel electrode 4302 is formed from a transparent conductive film having large work function. As the transparent conductive film, an indium oxide and tin oxide compound or an indium oxide and zinc oxide compound can be utilized. The transparent conductive film doped with gallium also can be used.

Then, an insulating film 4303 is formed on the pixel electrode 4302, and an opening portion is formed on the pixel electrode 4302. At the opening portion, an EL (electro-luminescence) layer 4304 is formed on the pixel electrode 4302. A known EL material is used as the light emitting layer 4304. Both of low molecular type (monomer based) materials and high molecular type (polymer based) materials can be used as EL materials. Combining materials of organic materials with the inorganic materials can be used as the light emitting layer.

A known evaporation or painting technique may be used to form the light emitting layer 4304. The light emitting layer may have a lamination structure by freely combining a hole injecting layer, a hole transporting layer, a light emitting layer, an electron transporting layer, and an electron injecting layer, or a single layer structure.

On the light emitting layer 4304, a cathode 4305 made of a conductive film having an element residing in group 1 or group 2 of the periodic table (typically, a conductive film comprising aluminum, copper, or silver as a main component, or a lamination film of those and other conductive film) is formed. It is preferable to remove as much as possible any moisture or oxygen existing in the interface between the cathode 4305 and the light emitting layer 4304. It is therefore necessary to use a method of depositing continuously the cathode 4305 and the light emitting layer 4304 in vacuum or depositing the light emitting layer 4304 in an atmosphere of nitrogen or in a rare gas atmosphere, thereby a cathode 4305 is formed without exposing to oxygen and moisture. The above film deposition becomes possible in this embodiment by using a multi-chamber method (cluster tool method) film deposition apparatus.

Then, the cathode 4305 is electrically connected to the wiring 4005 in the region denoted by reference numeral 4306. The wiring 4005 for imparting a predetermined voltage to the cathode 4305 is connected to the FPC 4006 through an anisotropic conductive material 4307.

As mentioned above, a light emitting element is made from the pixel electrode (anode) 4302, the light emitting layer 4304 and the cathode 4305. The light emitting element is enclosed with a first covering material 4101 and a covering material 4102 which is laminated with the substrate 4001 through a first sealing material 4101, and sealed with a filer material 4103.

Materials such as a glass plate, a metal plate (typically, a stainless steel plate), a ceramic plate and a plastic material (including a plastic film) can be used as the covering material 4102. As plastic material an FRP (fiberglass-reinforced plastic) plate, a PVF (polyvinyl fluoride) film, a Mylar film, a polyester film, and an acrylic film can be used. It is preferable to use a sheet structure in which aluminum foil is sandwiched by a PVF film or a Mylar film.

Note that, for a case in which the emission direction of light emitted from the light emitting element is directed to the covering material side, it is necessary for the covering material to possess transparency. In the case, a transparent material such as a glass plate, a plastic plate, a polyester film or an acrylic film can be used.

Additionally, a filler material 4103 is formed using ultraviolet curing resin or thermally curable resin. PVC (polyvinyl chloride), acrylic, polyimide, epoxy resin, silicone resin, PVB (polyvinyl butyral), and EVA (ethylene vinyl acetate) can be used as the filler material. If a drying agent (preferably barium oxide) is formed on the inside of the filler material 4103 or materials which can absorb oxygen, then it can suppress the degradation of the light emitting element.

Further, spacer may be contained in the filler material 4103. At this time, the spacer is formed by using barium oxide, thereby the spacer itself has a hygroscopic property. Further, in the case of providing the spacer, it is effective that a resin film is provided on the cathode 4305 as a buffer layer for relaxation of pressure from the spacer.

Further, the wiring 4005 is electrically connected to the FPC 4006 via the anisotropic conductive film 4307. The wiring 4005 transmits signals forwarding the pixel portion 4002, source side driving circuit 4003 and gate side driving circuit 4004 to the FPC 4006 and are electrically connected to external equipment through the FPC 4006.

Also, in this embodiment, a second sealing material 4104 is provided to cover an exposure portion of the first sealing material 4101 and portion of the FPC 4006 to obtain the structure in which the light emitting element is completely shut out from the outside. In this way, the EL display device has a cross sectional structure shown in FIG. 6B.

Figure 7:
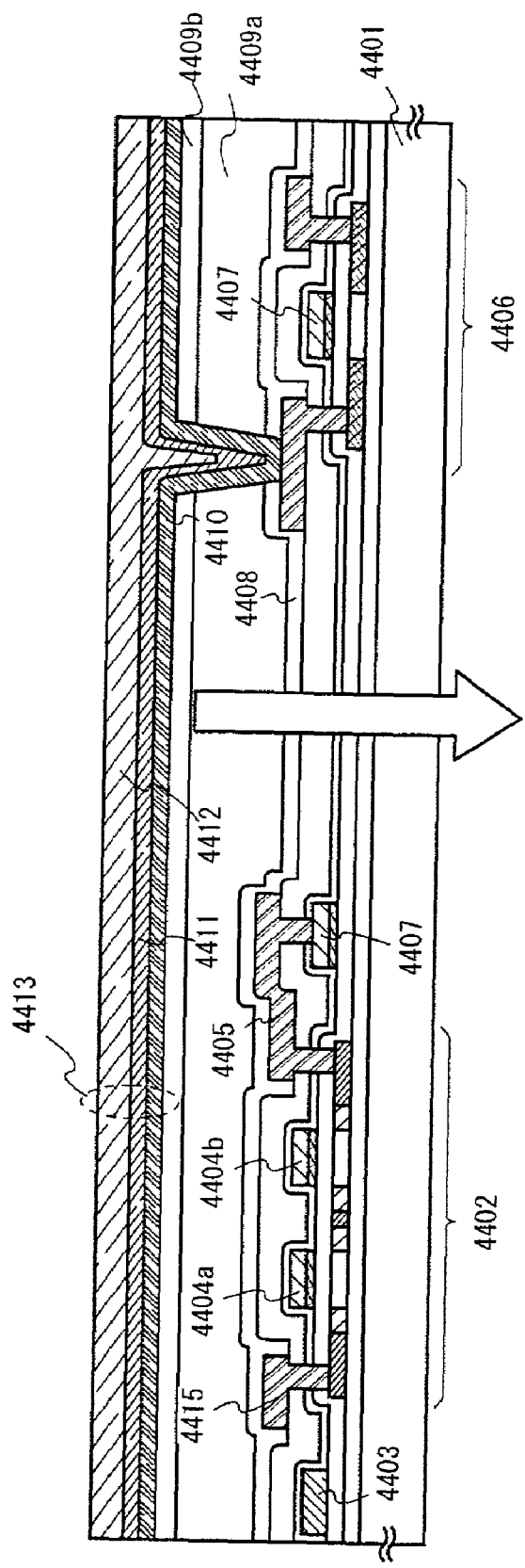
FIG. 7 is a view illustrating the structure of pixel portions.
Figure 8A:
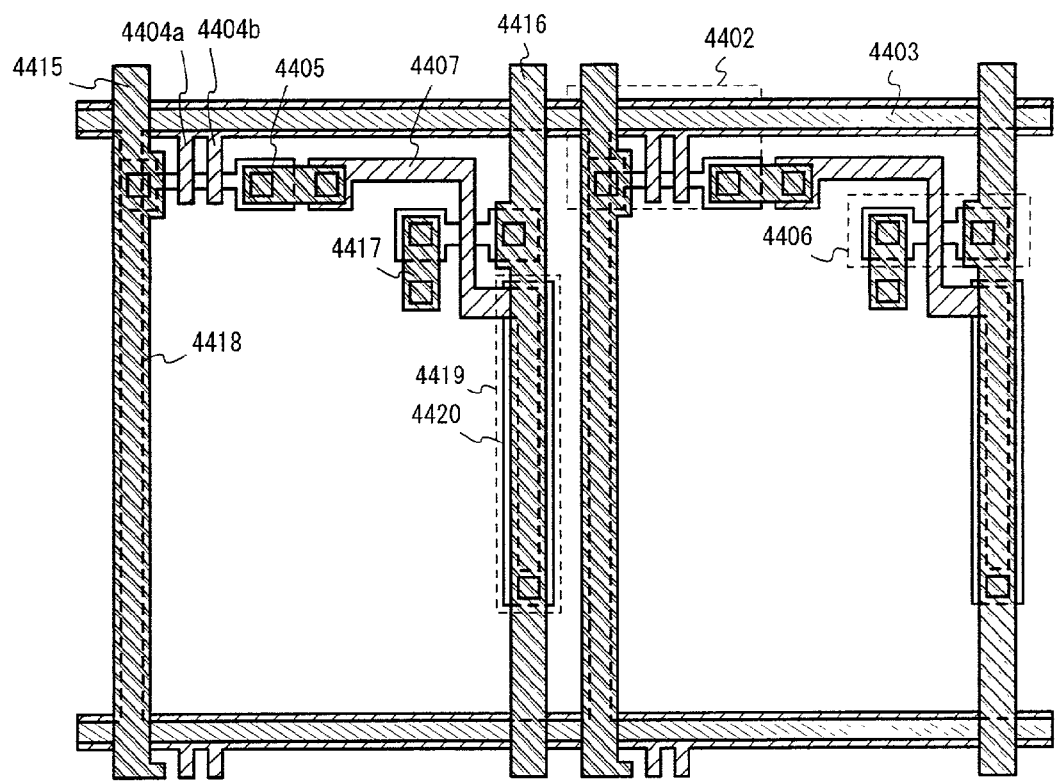
FIG. 8A is a view illustrating the structure of pixel portions, FIG. 8B being a circuit diagram.
Figure 8B:
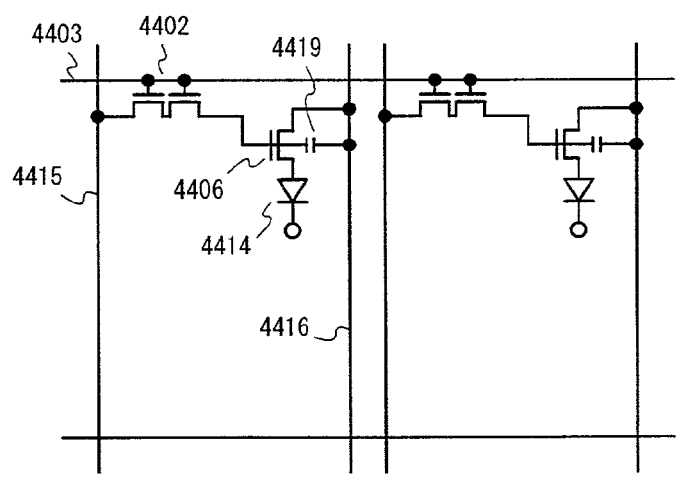

An additionally detailed cross sectional structure of the display portion is shown in FIG. 7 here, a top surface structure is shown in FIG. 8A and a circuit diagram is shown in FIG. 8B. FIGS. 7, 8A, and 8B use common reference symbols. Therefore, FIGS. 7 and 8 may be mutually referenced.

In FIG. 7, a switching TFT 4402 provided on a substrate 4401 is formed by using an n-channel TFT shown in FIG. 4. Thus, an explanation of the structure can be referred to that of an n-channel TFT. Further, a wiring denoted by reference numeral 4403 is a gate wiring electrically connected to gate electrodes 4404a and 4404b of the switching TFT 4402.

Note that, although a double gate structure in which two channel forming regions are formed is used in this embodiment, a single gate structure in which one channel forming region is formed, and a triple gate structure in which three channel forming regions are formed, may also be used.

Further, a drain wiring 4405 of the switching TFT 4402 is electrically connected to a gate electrode 4407 of a current control TFT 4406. Note that the current control TFT 4406 is formed by using a p-channel TFT 301 shown in FIG. 4. Thus, an explanation of the structure can be referred to that of a p-channel TFT 301. Note also that, although a single gate structure is used in this embodiment, a double gate structure and a triple gate structure may also be used.

A first passivation film 4408 is formed on the switching TFT 4402 and on the current control TFT 4406, and a leveling film 4409a made from a resin is formed on the first passivation film. Leveling of steps due to the TFTs by using the leveling film 4409 is extremely important. A light emitting layer subsequently formed is extremely thin, and therefore light emission irregularities may be caused by the existence of a step. It is thus preferable to perform leveling before forming a pixel electrode to be able to form the light emitting layer with a surface that is as level as possible. The interlayer insulating film 4409b consists of silicon and nitride as principle ingredients which characterize the present invention, is formed on the leveling film 4409a made from a resin material.

Furthermore, reference numeral 4410 denotes a pixel electrode (light emitting element anode) made from a transparent conducting film, and the pixel electrode is electrically connected to a drain wiring of the current control TFT 4406. A chemical compound of indium oxide and tin oxide, a chemical compound of indium oxide and zinc oxide, zinc oxide, tin oxide, and indium oxide can be used as the transparent conducting film. Further, a film in which gallium is added to the above films may also be used as a transparent conducting film.

A light emitting layer 4411 is formed on the pixel electrode 4410. Note that, although only one pixel is shown in FIG. 7, the light emitting layer is divided up and formed corresponding to the colors or R (red), G (green), and B (blue) in this embodiment. Further, a low molecular weight organic EL material may be formed by an evaporation method in this embodiment. Specifically, a lamination structure may be formed in which a 20 nm thick copper phthalocyanine (CuPc) film is formed as a hole injecting layer, and a 70 nm thick tris-8-aluminum quinolinolate complex (Alq$_3$) film may be formed on the CuPc film as a light emitting layer. The color of light emitted can be controlled by adding a fluorescing pigment such as quinacridon, perillin, and DCM1 to Alq$_3$.

Note that the above example is one example of EL materials capable of being used as the light emitting layer, and the light emitting layer need not be limited to these. An light emitting layer in which a light emitting layer, a charge transporting layer, and a charge injecting layer are freely combined (layers for emitting light and for performing transport of carriers for light emission) may also be used. For example, an example of using low molecular weight organic EL materials as the light emitting layer is shown in this embodiment, but high molecular weight organic EL materials may also be used. Further, it is also possible to use inorganic materials such as silicon carbide as charge transporting layers and charge injecting layers. Known materials can be used or these organic EL materials and inorganic materials.

A cathode 4412 made from a conducting film is formed next on the light emitting layer 4411. An alloy film of aluminum and lithium is used as the conducting film in the case of this embodiment. Of course, a known MgAg film (an alloy film of magnesium and silver) may also be used. A conducting film made from an element residing in group 1 or group 2 of the periodic table, or a conducting film to which one of the above elements is added, may be used as the cathode material.

A light emitting element 4413 is completed at the point where the cathode 4412 is formed. Note that the light emitting element 4413 indicates a capacitor formed by the pixel electrode (anode) 4410, the light emitting layer 4411, and the cathode 4412 here.

A top surface structure of the pixel in this embodiment is explained using FIG. 8A. A source region of the switching TFT 4402 is connected to a source wiring 4415, and a drain region of the switching TFT 4402 is connected to the drain wiring 4405. Further, the drain wiring 4405 is electrically connected to the gate electrode 4407 of the current control TFT 4406. A source region of the current control TFT 4406 is electrically connected to an electric power source supply line 4416, and a drain region of the current control TFT 4406 is electrically connected to a drain wiring 4417. Furthermore, the drain wiring 4417 is electrically connected to a pixel electrode (anode) 4418 shown by a dotted line.

A storage capacitor is formed at this point in a region denoted by reference numeral 4419. The storage capacitor 4419 is formed in between a semiconductor film 4420 electrically connected to the electric power source supply line 4416, an insulating film (not shown in the figures) formed on the same layer as a gate insulating film, and the gate electrode 4407. Furthermore, it is also possible to use a capacitance formed by the gate electrode 4407, a layer (not shown in the figures) which is the same as a first interlayer insulating film, and the electric power source supply line 4416 as a storage capacitor.

Embodiment 4

Figure 9:
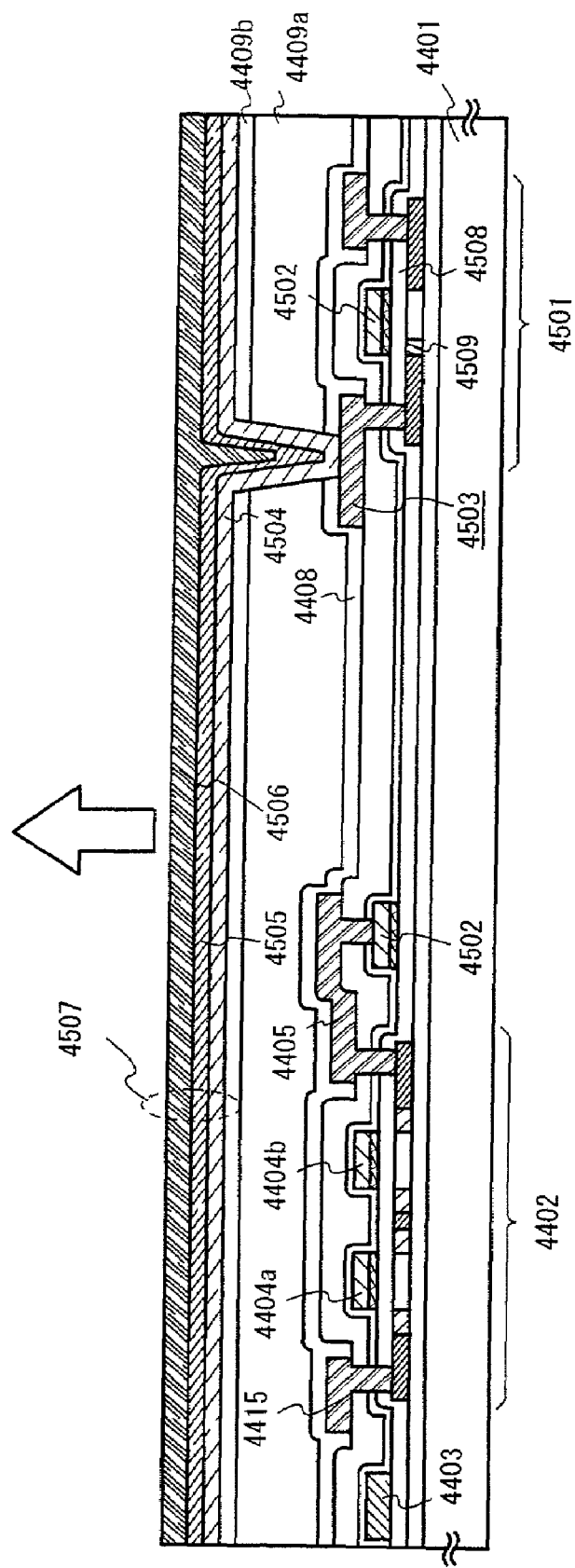
FIG. 9 is a view illustrating the structure of pixel portions.

An EL display device having a pixel structure that differs from that of Embodiment 3 is explained in this embodiment. FIG. 9 is used in the explanation. Note that the explanation of Embodiment 3 may be referred to regarding portions to which reference symbols identical to those of FIG. 8 are attached.

In FIG. 9, the same structure TFT as an n-channel TFT 302 shown in FIG. 4 is used as the current control TFT 4501. A gate electrode 4502 of the current control TFT 4501 is of course electrically connected to the drain wiring 4405 of the switching TFT 4402. Further, a drain wiring 4503 of the current control TFT 4501 is electrically connected to a pixel electrode 4504.

The pixel electrode 4504, comprising a conducting film functions as a cathode of a light emitting element in this embodiment. Specifically, an alloy film of aluminum and lithium is used. However, a conducting film made from an element residing in group 1 or group 2 of the periodic table, and a conducting film to which one of the above elements is added, may also be used.

A light emitting layer 4505 is formed on the pixel electrode 4504. Note that, although only one pixel is shown by FIG. 9, a light emitting layer corresponding to the color G (green) is formed in this embodiment by an evaporation method or an application method (preferably spin coating). Specifically, a lamination structure is used, in which a 20 nm thick lithium fluoride (LiF) film is formed as an electron injecting layer, and a 70 nm thick PPV (polyparaphenylene vinylene) film is formed on the LiF film as a light emitting layer.

Next, an anode 4506 is formed on the light emitting layer 4505 from a transparent conducting film. A conducting film comprising a chemical compound of indium oxide and tin oxide, or a chemical compound of indium oxide and zinc oxide, is used as the transparent conducting film in the case of this embodiment.

A light emitting element 4507 is completed at the point where the anode 4506 is formed. Note that the light emitting element 4507 referred to here indicate a capacitor formed by the pixel electrode (cathode) 4504, the light emitting layer 4505, and the anode 4506.

For a case of a high voltage equal to or greater than 10 V applied to the light emitting element, degradation due to the hot carrier effect in the current control TFT 4501 appears. It is effective in this case to use an n-channel TFT of the structure of the present invention as the current control TFT 4501.

Further, the current control TFT 4501 of this embodiment forms a parasitic capacitance between the gate electrode 4502 and the LDD region 4509 referred to as a gate capacitance. By regulating the gate capacitance, it can be made to possess a function similar to that of the storage capacitor 4418 shown in FIGS. 8A and 8B. In particular, the capacitance of the storage capacitor may be smaller for a case of operating the EL display device by a digital driving method than for a case of an analog driving method operation, and therefore the storage capacitor can be substituted by the gate capacitance.

Note that for cases in which the voltage applied to the light emitting element is 10 V or less, preferably equal to or less than 5 V, there is almost no problem of degradation due to the above hot carrier effect, and therefore an n-channel TFT having a structure in which the LDD region 4509 is omitted may also be used in FIG. 9.

Thus an inorganic insulating film or a carbon film is formed on an interlayer insulating film comprising an organic material to thereby enable preventing oxygen and moisture from entering a side of a light emitting element from a side of the interlayer insulating film and deterioration of the light emitting element. Also, it is also possible to prevent mobile ions from being dispersed toward a TFT from the light emitting element thus enabling suppressing variation in the threshold value of the TFT. These make it possible to suppress generation of dark spots in the light emitting element and deterioration of luminance and to enhance reliability of a TFT. A light emitting element having less dark spots and less deterioration can be formed on an organic resin substrate.

What is claimed is:

1. A method of fabricating a light emitting device comprising:
    forming an interlayer insulating film, which comprises an organic material, over a thin film transistor, wherein the thin film transistor includes a semiconductor film, a gate insulating film, and a gate electrode;
    forming an inorganic insulating film on the interlayer insulating film by sputtering at a temperature of 150° C. to 250° C., the inorganic insulating film comprising silicon at a content at least 25.0 atomic % and at most 35.0 atomic % and nitrogen at a content at least 35.0 atomic % and at most 65.0 atomic %; and
    forming a light emitting element, which has a light emitting layer between a pair of electrodes, over the inorganic insulating film.

2. A method according to claim 1, wherein the interlayer insulating film comprising an organic material is formed by means of a coating method.

3. A method according to claim 1, wherein the light emitting device comprises an EL display device.

4. A method according to claim 1, wherein the light emitting device is used in an electronic equipment selected from the group consisting of personal computers, video cameras, portable type information terminals, digital cameras, digital video disk players, and projectors.

5. A method of fabricating a light emitting device comprising:
    forming an interlayer insulating film, which comprises an organic material, over a thin film transistor, wherein the thin film transistor includes a semiconductor film, a gate insulating film, and a gate electrode;
    forming an inorganic insulating film on the interlayer insulating film by sputtering at a temperature of 150° C. to 250° C., the inorganic insulating film comprising silicon at a content at least 25.0 atomic % and at most 35.0 atomic % and nitrogen at a content of at least 35.0 atomic % and at most 65.0 atomic %;
    forming an electrode over the inorganic insulating film; and
    forming a light emitting layer comprising an organic material over the electrode.

6. A method according to claim 5, wherein the interlayer insulating film comprising an organic material is formed by means of a coating method.

7. A method according to claim 5, wherein the light emitting device comprises an EL display device.

8. A method according to claim 5, wherein the light emitting device is used in an electronic equipment selected from the group consisting of personal computers, video cameras, portable type information terminals, digital cameras, digital video disk players, and projectors.

9. A method of fabricating a light emitting device comprising:
    forming an interlayer insulating film comprising an organic material over a thin film transistor, wherein the thin film transistor includes a semiconductor film, a gate insulating film, and a nate electrode;
    forming an inorganic insulating film comprising silicon and nitrogen over the interlayer insulating film by sputtering at a temperature of 150° C. to 250° C., wherein a composition ratio of nitrogen is higher than a composition ratio of oxygen in the film; and
    forming a light emitting element comprising a light emitting layer between a pair of electrodes, over the inorganic insulating film.

10. A method according to claim 9, wherein the interlayer insulating film comprising an organic material is formed by means of a coating method.

11. A method according to claim 9, wherein the light emitting device comprises an EL display device.

12. A method according to claim 9, wherein the light emitting device is used in an electronic equipment selected from the group consisting of personal computers, video cameras, portable type information terminals, digital cameras, digital video disk players, and projectors.

13. A method of fabricating a light emitting device comprising:
    forming an interlayer insulating film comprising an organic material over a thin film transistor, wherein the thin film transistor includes a semiconductor film, a gate insulating film, and a gate electrode;
    forming an inorganic insulating film comprising silicon and nitrogen over the interlayer insulating film by sputtering at a temperature of 150° C. to 250° C., wherein a composition ratio of nitrogen is higher than a composition ratio of oxygen in the film;
    forming an electrode over the inorganic insulating film; and
    forming a light emitting layer comprising an organic material over the electrode.

14. A method according to claim 13, wherein the interlayer insulating film comprising an organic material is formed by means of a coating method.

15. A method according to claim 13, wherein the light emitting device comprises an EL display device.

16. A method according to claim 13, wherein the light emitting device is used in an electronic equipment selected from the group consisting of personal computers, video cameras, portable type information terminals, digital cameras, digital video disk players, and projectors.

17. A method of fabricating a light emitting device comprising:
    forming an interlayer insulating film comprising an organic material over a thin film transistor, wherein the thin film transistor includes a semiconductor film, a gate insulating film, and a gate electrode;
    forming an inorganic insulating film comprising silicon and nitrogen over the interlayer insulating film by sputtering using a sputtering gas including $N_2$, $H_2$, and $N_{20}$; and
    forming a light emitting element comprising a light emitting layer between a pair of electrodes, over the inorganic insulating film.

18. A method according to claim 17, wherein the interlayer insulating film comprising an organic material is formed by means of a coating method.

19. A method according to claim 17, wherein the light emitting device comprises an EL display device.

20. A method according to claim 17, wherein the light emitting device is used in an electronic equipment selected from the group consisting of personal computers, video cameras, portable type information terminals, digital cameras, digital video disk players, and projectors.

21. A method according to claim 17, wherein the inorganic insulating film is formed at a temperature of 150° C. to 250° C.

22. A method of fabricating a light emitting device comprising:
   forming an interlayer insulating film comprising an organic material over a thin film transistor, wherein the thin film transistor includes a semiconductor film, a gate insulating film, and a gate electrode;
   forming an inorganic insulating film comprising silicon and nitrogen over the interlayer insulating film by sputtering using a sputtering gas including $N_2$ and Ar; and
   forming a light emitting element comprising a light emitting layer between a pair of electrodes, over the inorganic insulating film.

23. A method according to claim 22, wherein the interlayer insulating film comprising an organic material is formed by means of a coating method.

24. A method according to claim 22, wherein the light emitting device comprises an EL display device.

25. A method according to claim 22, wherein the light emitting device is used in an electronic equipment selected from the group consisting of personal computers, video cameras, portable type information terminals, digital cameras, digital video disk players, and projectors.

26. A method according to claim 22, wherein the inorganic insulating film is formed at a temperature of 150° C. to 250° C.

* * * * *